United States Patent
Cesaretti et al.

(10) Patent No.: US 8,542,010 B2
(45) Date of Patent: Sep. 24, 2013

(54) CIRCUITS AND METHODS FOR GENERATING A DIAGNOSTIC MODE OF OPERATION IN A MAGNETIC FIELD SENSOR

(75) Inventors: Juan Manuel Cesaretti, Ciudad de Buenos Aires (AR); Gerardo Monreal, Pilar Buenos Aires (AR); William P. Taylor, Amherst, NH (US); Michael C. Doogue, Manchester, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 244 days.

(21) Appl. No.: 12/840,324

(22) Filed: Jul. 21, 2010

(65) Prior Publication Data

US 2011/0018533 A1    Jan. 27, 2011

Related U.S. Application Data

(60) Provisional application No. 61/227,628, filed on Jul. 22, 2009.

(51) Int. Cl.
*G01R 33/06* (2006.01)
(52) U.S. Cl.
USPC ........... 324/251; 324/202; 324/260; 702/117; 702/183
(58) Field of Classification Search
USPC ................. 324/202, 251, 260; 702/117, 183
See application file for complete search history.

(56) References Cited

U.S. PATENT DOCUMENTS

| | | | |
|---|---|---|---|
| 4,236,832 A | 12/1980 | Komatsu et al. |
| 4,438,347 A | 3/1984 | Gehring |
| 4,752,733 A | 6/1988 | Petr et al. |
| 4,758,943 A | 7/1988 | Aström et al. |
| 4,760,285 A | 7/1988 | Nelson |
| 4,823,075 A | 4/1989 | Alley |
| 4,833,406 A | 5/1989 | Foster |
| 4,970,411 A | 11/1990 | Halg et al. |
| 5,247,278 A | 9/1993 | Pant et al. |
| 5,329,416 A | 7/1994 | Ushiyama et al. |
| 5,343,143 A | 8/1994 | Voisine et al. |
| 5,412,255 A | 5/1995 | Wallrafen |

(Continued)

FOREIGN PATENT DOCUMENTS

| DE | 195 39 458 A1 | 4/1997 |
|---|---|---|
| DE | 10 2006 037 226 A1 | 2/2008 |

(Continued)

OTHER PUBLICATIONS

Cesaretti et al.; "Circuits and Methods for Self-Calibrating or Self-Testing a Magnetic Field Sensor;" U.S. Appl. No. 13/095,371, filed Apr. 27, 2011; 62 pages.

(Continued)

*Primary Examiner* — Arleen M Vazquez
*Assistant Examiner* — Alesa Allgood
(74) *Attorney, Agent, or Firm* — Daly, Crowley, Mofford & Durkee, LLP

(57) ABSTRACT

A magnetic field sensor includes a diagnostic circuit that allows a self-test of most of or all of, the circuitry of the magnetic field sensor, including a self-test of a magnetic field sensing element used within the magnetic field sensor. The magnetic field sensor can generate a diagnostic magnetic field to which the magnetic field sensor is responsive.

23 Claims, 30 Drawing Sheets

(56) References Cited

U.S. PATENT DOCUMENTS

| | | | |
|---|---|---|---|
| 5,424,558 | A | 6/1995 | Borden et al. |
| 5,469,058 | A | 11/1995 | Dunnam |
| 5,521,501 | A | 5/1996 | Dettmann et al. |
| 5,621,319 | A | 4/1997 | Bilotti et al. |
| 5,640,090 | A | 6/1997 | Furuya et al. |
| 5,844,140 | A | 12/1998 | Seale |
| 6,011,770 | A | 1/2000 | Tan |
| 6,351,506 | B1 | 2/2002 | Lewicki |
| 6,392,478 | B1 | 5/2002 | Mulder et al. |
| 6,436,748 | B1 | 8/2002 | Forbes et al. |
| 6,437,558 | B2 | 8/2002 | Li et al. |
| 6,853,178 | B2 | 2/2005 | Hayat-Dawoodi |
| 6,896,407 | B2 | 5/2005 | Nomiyama et al. |
| 6,917,321 | B1 | 7/2005 | Haurie et al. |
| 7,038,448 | B2 | 5/2006 | Schott et al. |
| 7,190,784 | B2 | 3/2007 | Li |
| 7,259,545 | B2 | 8/2007 | Stauth et al. |
| 7,292,095 | B2 | 11/2007 | Burt et al. |
| 7,319,319 | B2 | 1/2008 | Jones et al. |
| 7,323,870 | B2 | 1/2008 | Tatschl et al. |
| 7,325,175 | B2 | 1/2008 | Momtaz |
| 7,425,821 | B2 | 9/2008 | Monreal et al. |
| 7,474,093 | B2 | 1/2009 | Ausserlechner |
| 7,518,354 | B2 | 4/2009 | Stauth et al. |
| 7,605,647 | B1 | 10/2009 | Romero et al. |
| 7,635,993 | B2 | 12/2009 | Boeve |
| 7,694,200 | B2 | 4/2010 | Forrest et al. |
| 7,701,208 | B2 * | 4/2010 | Nishikawa .............. 324/251 |
| 7,729,675 | B2 | 6/2010 | Krone |
| 7,746,056 | B2 | 6/2010 | Stauth et al. |
| 7,746,065 | B2 * | 6/2010 | Pastre et al. ............ 324/202 |
| 7,764,118 | B2 | 7/2010 | Kusuda et al. |
| 7,769,110 | B2 | 8/2010 | Momtaz |
| 7,800,389 | B2 | 9/2010 | Friedrich et al. |
| 7,923,996 | B2 | 4/2011 | Doogue et al. |
| 7,936,144 | B2 | 5/2011 | Vig et al. |
| 7,961,823 | B2 | 6/2011 | Kolze et al. |
| 7,990,209 | B2 | 8/2011 | Romero |
| 8,030,918 | B2 | 10/2011 | Doogue et al. |
| 8,128,549 | B2 | 3/2012 | Testani et al. |
| 8,134,358 | B2 * | 3/2012 | Charlier et al. ............ 324/202 |
| 2002/0084923 | A1 | 7/2002 | Li |
| 2003/0038675 | A1 | 2/2003 | Gailus et al. |
| 2003/0102909 | A1 | 6/2003 | Motz |
| 2006/0202692 | A1 | 9/2006 | Tatschl et al. |
| 2007/0110199 | A1 | 5/2007 | Momtaz et al. |
| 2007/0247141 | A1 | 10/2007 | Pastre et al. |
| 2007/0285089 | A1 * | 12/2007 | Ibuki et al. ............ 324/260 |
| 2008/0094055 | A1 | 4/2008 | Monreal et al. |
| 2008/0137784 | A1 | 6/2008 | Krone |
| 2008/0238410 | A1 | 10/2008 | Charlier et al. |
| 2009/0001964 | A1 | 1/2009 | Strzalkowski et al. |
| 2009/0001972 | A1 | 1/2009 | Fernandez et al. |
| 2009/0085706 | A1 | 4/2009 | Baarman et al. |
| 2010/0211347 | A1 | 8/2010 | Friedrich et al. |
| 2011/0048102 | A1 | 3/2011 | Fernandez et al. |
| 2011/0298448 | A1 | 12/2011 | Foletto et al. |
| 2013/0093412 | A1 | 4/2013 | Anelli et al. |

FOREIGN PATENT DOCUMENTS

| | | |
|---|---|---|
| DE | 10 2007 041 230 B3 | 4/2009 |
| EP | 0 289 414 A2 | 11/1988 |
| EP | 0 289 414 A3 | 11/1988 |
| EP | 0 338 122 | 10/1989 |
| EP | 0 357 013 A2 | 3/1990 |
| EP | 0 357 013 A3 | 3/1990 |
| EP | 1 637 898 A1 | 3/2006 |
| EP | 1 679 524 A1 | 7/2006 |
| EP | 1 850 143 A1 | 10/2007 |
| GB | 2 276 727 A | 10/1994 |
| JP | SHO 61-48777 | 3/1986 |
| JP | 2004-177228 A | 6/2004 |
| JP | 2006-123012 A | 5/2006 |
| JP | 2008-513762 A | 5/2008 |
| JP | 2011-052036 A | 3/2011 |
| WO | WO 96/02849 A1 | 2/1996 |
| WO | WO 2004/072672 | 8/2004 |
| WO | WO 2006/056829 | 6/2006 |
| WO | WO 2007/138508 A1 | 12/2007 |
| WO | WO 2008/048379 A1 | 4/2008 |
| WO | WO 2009/108422 A2 | 9/2009 |
| WO | WO 2009/108422 A3 | 9/2009 |
| WO | WO 2010/096367 A1 | 8/2010 |
| WO | WO 2011/011479 | 1/2011 |

OTHER PUBLICATIONS

PCT International Preliminary Report on Patentability and Written Opinion of the ISA; dated Feb. 2, 2012; for PCT Pat. App. No. PCT/US2010/042694; 11 sheets.

Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.

Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.

Ausserlechner; "Limits of Offset Cancellation by the Principle of Spinning Current Hall Probe;" Proceedings of IEEE Sensors; Oct. 2004; pp. 1117-1120.

Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.

Bahreyni, et al.; "A Resonant Micromachined Magnetic Field Sensor;" IEEE Sensors Journal; vol. 7, No. 9, Sep. 2007; pp. 1326-1334.

Barrettino, et al.; "CMOS-Based Monolithic Controllers for Smart Sensors Comprising Micromembranes and Microcantilevers;" IEEE Transactions on Circuits and Systems-I Regular Papers vol. 54, No. 1; Jan. 2007; pp. 141-152.

Baschirotto et al.; "Development and Analysis of PCB Vector 2-D Magnetic Field Sensor System for Electronic Compass;" IEEE Sensors Journal vol. 6, No. 2; Apr. 2006; pp. 365-371.

Bilotti et al.; "Monolithic Magnetic Hall Sensor Using Dynamic Quadrature Offset Cancellation;" IEEE Journal of Solid-State Circuits; vol. 32, Issue 6; Jun. 1997; pp. 829-836.

Demierre, et al.; "Reference Magnetic Actuator for Self-Calibration of a Very Small Hall Sensor Array;" Sensors and Actuators A97-98; Apr. 2002; pp. 39-46.

Frick, et al.; "CMOS Microsystem for AC Current Measurement with Galvanic Isolation;" IEEE Sensors Journal; vol. 3, No. 6; Dec. 2003; pp. 752-760.

Halg; "Piezo-Hall Coefficients of n-Type Silicon;" Journal of Applied Physics; vol. 64, No. 1; Jul. 1, 1988; pp. 276-282.

Hosticka; "CMOS Sensor Systems;" Sensors and Actuators A66; Apr. 1998; pp. 335-341.

Kanda et al.; "The Piezo-Hall Effect in n-Silicon;" $22^{nd}$ International Conference on the Physics of Semiconductors; vol. 1, Jan. 1995; pp. 89-92.

Krammerer et al.: "A Hall effect sensors network insensitive to mechanical stress;" Proceedings of IEEE Sensors; vol. 3, Oct. 2004; pp. 1071-1074.

Mangnani et al.; "Mechanical Stress Measurement Electronics Based on Piezo-Resistive and Piezo-Hall Effects;" $9^{th}$ International Conference on Electronics, Circuits and Systems 2002; vol. 1; SBN: 0-7803-7596-3; Dec. 2002; pp. 363-366.

Manic et al.; "Short and Long-Term Stability Problems of Hall Plates in Plastic Packages;" IEEE $38^{th}$ Annual International Reliability Physics Symposium; Apr. 2000; pp. 225-230.

Manic; "Drift in Silicon Integrated Sensors and Circuits Due to the Thermo-Mechanical Stresses;" Lausanne, École Polytechnique Fédérale De Lausanne 2000; 176 pages.

Motz et al.; "An Integrated Magnetic Sensor with Two Continuous-Time ΔΣ-Converters and Stress Compensation Capability;" IEEE International Solid-State Circuits Conference; Digest of Technical Papers; Feb. 6, 2006; ISBN: 1-4244-0079-1; pp. 1151-1160.

Motz, et al.; "A Chopped Hall Sensor with Small Jitter and Programmable "True Power-On" Function;" IEEE Journal of Solid-State Circuits; vol. 40, No. 7; Jul. 2005; pp. 1533-1540.

Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.

Munter; "A Low-offset Spinning-current Hall Plate;" Sensors and Actuators A21-A23; 1990; pp. 742-746.
Munter; "Electronic Circuitry for a Smart Spinning-current Hall Plate with Low Offset;" Sensors and Actuators A; Jun. 1991;.pp. 747-751.
Partin et al.; "Temperature Stable Hall Effect Sensors;" IEEE Sensors Journal, vol. 6, No. 1; Feb. 2006; pp. 106-110.
Pastre, et al.; "A Hall Sensor Analog Front End for Current Measurement with Continuous Gain Calibration;" IEEE Sensors Journal; vol. 7, No. 5; May 2007; pp. 860-867.
Pastre, et al.; "A Hall Sensor-Based Current Measurement Microsystem With Continuous Gain Calibration;" Research in Microelectronics and Electronics, IEEE vol. 2; Jul. 25; 2005; ISBN: 0-7803-9345-7; pp. 95-98.
Popovic; "Sensor Microsystems;" Proc. 20$^{th}$ International Conference on Microelectronics (MWIL 95); vol. 2, NIS, Serbia, 12-14; Sep. 1995; pp. 531-537.
Randhawa; "Monolithic Integrated Hall Devices in Silicon Circuits;" Microelectronics Journal; vol. 12, No. 6; Sep. 14-17, 1981; pp. 24-29.
Ruther et al.; "Integrated CMOS-Based Sensor Array for Mechanical Stress Mapping;" 5$^{th}$ IEEE Conference on Sensors, Oct. 2007; pp. 1131-1134.
Ruther et al.; "Theromagnetic Residual Offset in Integrated Hall Plates;" IEEE Sensors Journal; vol. 3, No. 6; Dec. 2003; pp. 693-699.
Sargent; "Switched-capacitor IC controls feedback loop;" EDN; Design Ideas; Feb. 17, 2000; pp. 154 and 156.
Schneider, et al.; "Temperature Calibration of CMOS Magnetic Vector Probe for Contactless Angle Measurement System;" IEDM; Dec. 1996; pp. 533-536.
Schott et al.; "Linearizing Integrated Hall Devices;" 1997 International Conference on Solid-State Sensors and Actuators, Jun. 16-19, 1997; pp. 393-396.
Schott, et al.; "CMOS Single-Chip Electronic Compass with Microcontroller;" IEEE Journal of Solid-State Circuits; vol. 42, No. 12; Dec. 2007; pp. 2923-2933.
Simon et al.; "Autocalibration of Silicon Hall Devices;" 8$^{th}$ International Conference on Solid-State Sensors and Actuators; vol. 2; Jun. 25, 1995; pp. 237-240.
Steiner et al; Offset Reduction in Hall Devices by Continuous Spinning Current Method; Sensors and Actuators A66; 1998; pp. 167-172.
Steiner: "Double-Hall Sensor with Self-Compensated Offset;" Electron Devices Meeting; IDSM '97 Technical Digest; Dec. 7-10, 1997; pp. 911-914.
Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.
Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.
Trontelj et al; "CMOS Integrated Magnetic Field Source Used as a Reference in Magnetic Field Sensors on Common Substrate;" WEP 1-6; IMTC; May 1994; pp. 461-463.
Wu, et al.; "A Chopper Current-Feedback Instrumentation Amplifier with a 1mHz 1/f Noise Corner and an AC-Coupled Ripple-Reduction Loop;" IEEE International Solid-State Circuits Conference; Feb. 10, 2009; pp. 322-324.
Zou et al.; "Three-Dimensional Die Surface Stress Measurements in Delaminated and Non-Delaminated Plastic Packages;" 48th Electronic Components and Technology Conference; May 25, 1998; pp. 1223-1234.
PCT Search Report and Written Opinion of the ISA for PCT/US2009/031776 dated Oct. 23, 2009.
PCT International Preliminary Report on Patentability and Written Opinion mailed Sep. 10, 2010 for PCT/US2009/031776.
PCT Search Report and Written Opinion of the ISA for PCT/US2010/024256 dated Aug. 11, 2010.
PCT International Preliminary Report on Patentability and Written Opinion of the ISA for PCT Pat. App. No. PCT/US2010/024256; dated Sep. 1, 2011; 9 pages.
EP Official Communication; dated Feb. 23, 2012; for EP. Pat. App. No. 10739429.8; 2 pages.
Cessaretti et al; "Circuits and Methods Using Adjustable Feedback for Self-Calibrating or Self-Testing a Magnetic Field Sensor with an Adjustable Time Constraint;" U.S. Appl. No. 13/398,127; 85 pages.
U.S. Pat. No. 7,923,996; issued on Apr. 12, 2011; Part 1 of 5; 300 pages.
U.S. Pat. No. 7,923,996; issued on Apr. 12, 2011; Part 2 of 5; 300 pages.
U.S. Pat. No. 7,923,996; issued on Apr. 12, 2011; Part 3 of 5; 300 pages.
U.S. Pat. No. 7,923,996; issued on Apr. 12, 2011; Part 4 of 5; 300 pages.
U.S. Pat. No. 7,923,996; issued on Apr. 12, 2011; Part 5 of 5; 279 pages.
U.S. Pat. No. 8,030,918; issued on Oct. 4, 2011; 534pages.
U.S. Appl. No. 12/706,318, filed Feb. 16, 2010; Part 1 of 9; 350 pages.
U.S. Appl. No. 12/706,318, filed Feb. 16, 2010; Part 2 of 9; 350 pages.
U.S. Appl. No. 12/706,318, filed Feb. 16, 2010; Part 3 of 9; 350 pages.
U.S. Appl. No. 12/706,318, filed Feb. 16, 2010; Part 4 of 9; 200 pages.
U.S. Appl. No. 12/706,318, filed Feb. 16, 2010; Part 5 of 9; 150 pages.
U.S. Appl. No. 12/706,318, filed Feb. 16, 2010; Part 6 of 9; 350 pages.
U.S. Appl. No. 12/706,318, filed Feb. 16, 2010; Part 7 of 9; 200 pages.
U.S. Appl. No. 12/706,318, filed Feb. 16, 2010; Part 8 of 9; 150 pages.
U.S. Appl. No. 12/706,318, filed Feb. 16, 2010; Part 9 of 9; 350 pages.
PCT Search Report and Written Opinion of the ISA for PCT Pat. App. No. PCT/US2012/032315; dated Jun. 22, 2012; 16 pages.
Office Action dated Jul. 6, 2012; for U.S. Appl. No. 12/706,318, filed Feb. 16, 2010; 24 pages.
Office Action dated Jul. 6, 2012; for U.S. Appl. No. 12/706,318; 29 pages.
PCT Search Report and Written Opinion of the ISA for PCT/US2010/042694 dated Sep. 27, 2010.
U.S. Appl. No. 13/743,451, filed Jan. 17, 2013, Friedrich et al.
U.S. Notice of Allowance; dated Dec. 10, 2012; for U.S. Appl. No. 12/706,318; 9 pages.
European Response to Written Opinion; dated Sep. 4, 2012; for European Pat. App. No. 10739429.8; 11 pages.
Response to European Written Opinion; filed on Sep. 4, 2012; for EP Pat. App. No. 10739429.8; 11 pages.
Letter to NTD Patent and Trademark Agency Ltd.; dated Dec. 11, 2012; with instructions to file Response to Official Action; for Chinese Pat. App. No. 200980106535.4; 3 pages.
Letter from NTD Patent and Trademark Agency Ltd.; dated Jan. 19, 2013; enclosing Response to Official Action; for Chinese Pat. App. No. 200980106535.4; 14 pages.
European Notice of Allowance; dated Jan. 4, 2013; for European Pat. App. No. 10 739 429.8; 7 pages.
European Notice of Allowance; dated Jan. 4, 2013; for EP Pat. App. No. 10 739 429.8; 89 pages.
Letter from Yuasa & Hara; dated May 27, 2013; for JP Pat. App. No. 2010-547666; 2 pages.
Japanese Notice of Reasons for Rejection (English translation); dated Apr. 4, 2013; for JP Pat. App. No. 2010-547666; 4 pages.
Chinese Office Action dated Apr. 15, 2013; for CN Pat. App. No. 200980106535.4 4 pages.
Translation of Chinese Office Action; dated Apr. 15, 2013; for CN Pat. App. No. 200980106535.4 5 pages.
Office Action dated Jun. 11, 2013; for U.S. Appl. No. 13/095,371; 31 pages.
Office Action dated Jun. 12, 2013; U.S. Appl. No. 13/743,451; 24 pages.
Translated Chinese Office Action dated Apr. 15, 2013; for CN Pat. App. No. 200980106565.4; 5 pages.
Chinese Office Action dated Apr. 15, 2013; for CN Pat. App. No. 200980106565.4; 4 pages.
Blagojevic et al.; "FD SOI Hall Sensor Electronics Interfaces for Energy Measurement;" Microelectronics Journal 37; Sep. 2006; pp. 1576-1583.
Kayal el al.; "Automatic Calibration of Hall Sensor Microsystems;" Microelectronics Journal 37; Sep. 2006; pp. 1569-1575.
PCT Search Report and Written Opinion; dated May 27, 2013; for PCT Pat. App. No. PCT/US2013/021143; 13 pages.
Letter to NTD Patent and Trademark Agency; dated Jun. 19, 2013; for Chinese Pat. App. No. 200980106535.4; 11 pages.
Letter from NTD Patent and Trademark Agency; dated Jul. 11, 2013; for Chinese Pat. App. No. 200980106535.4; 1 page.
Chinese Response to Office Action; filed Jun. 27, 2013; for Chinese Pat. App. No. 200980106535.4; 12 pages.
European Search Report; dated Jul. 4, 2013; for EP Pat. App. No. 13169661.9; 11 pages.

\* cited by examiner

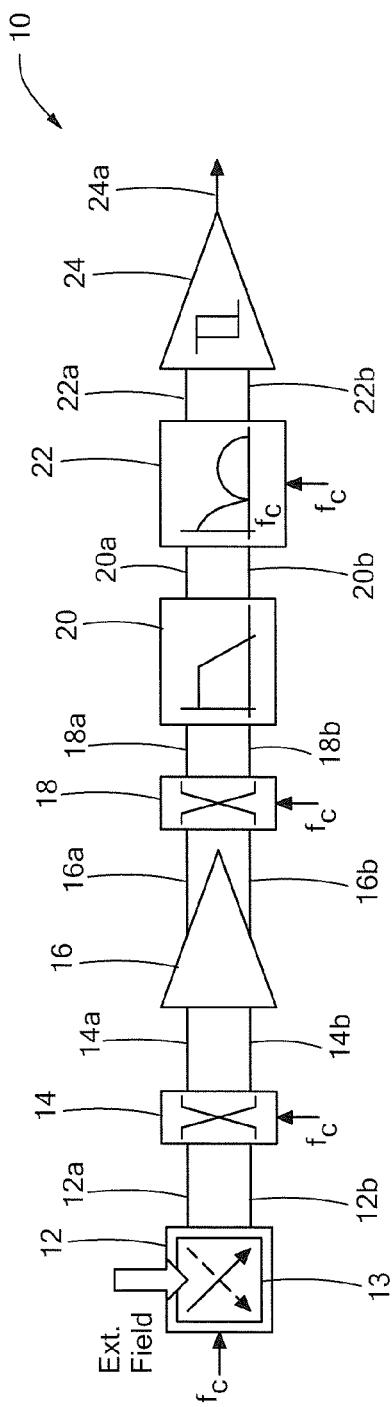
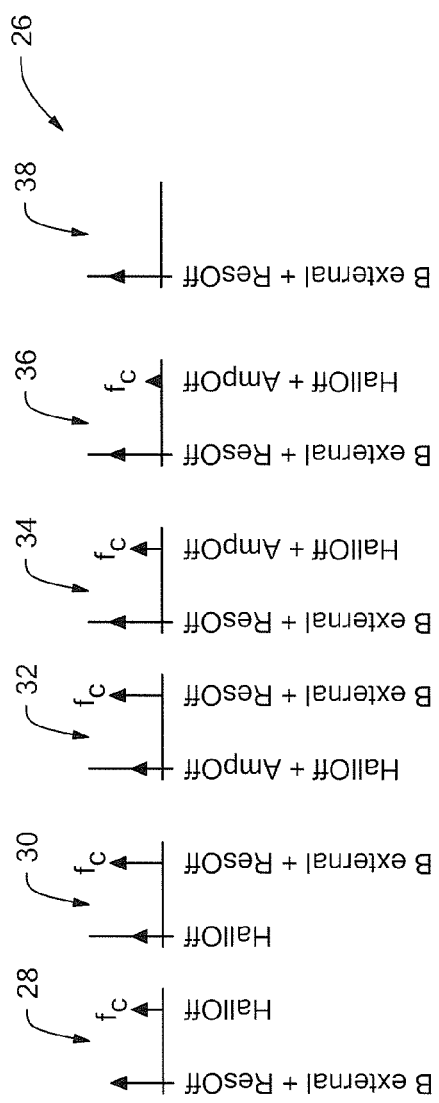
FIG. 1 (PRIOR ART)
FIG. 1A (PRIOR ART)

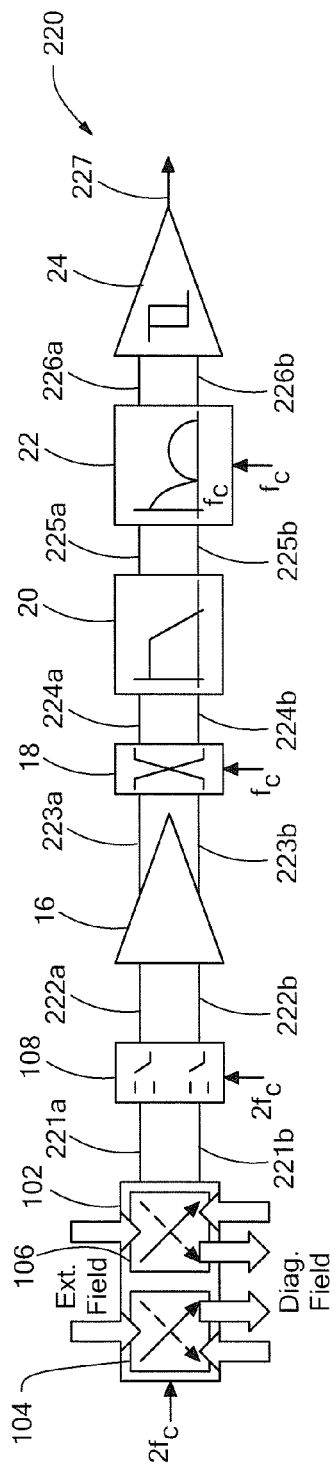
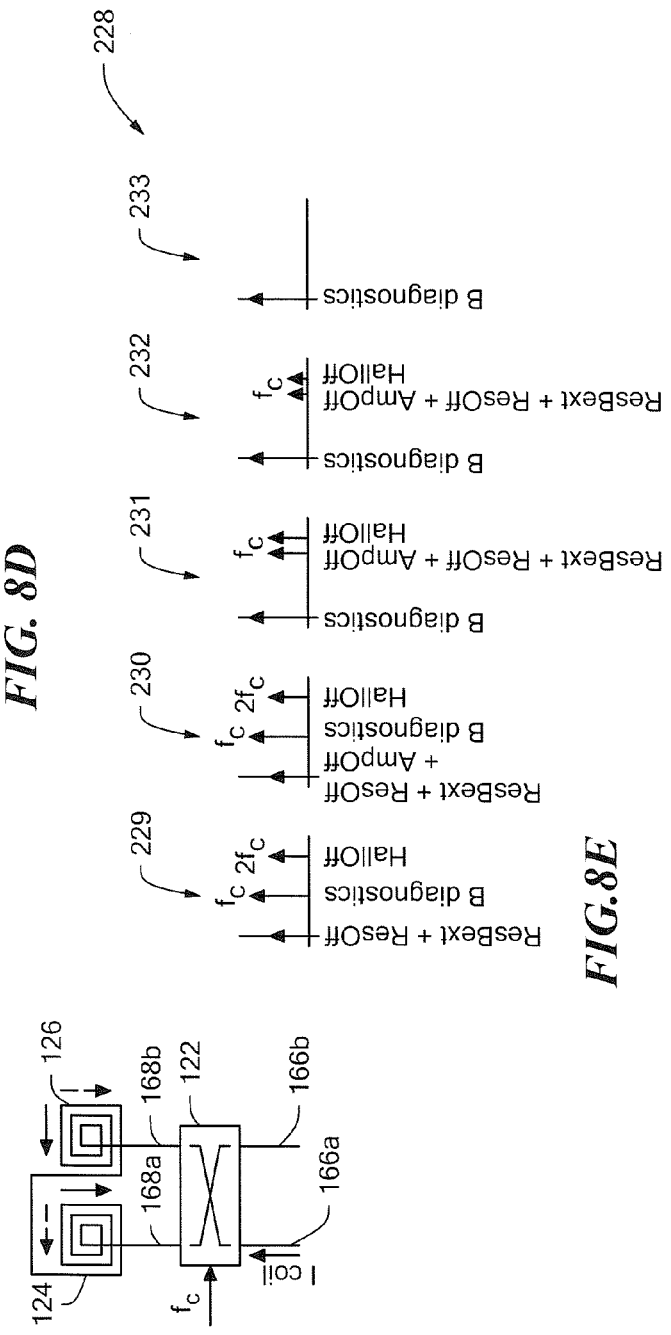
*FIG. 8D*
*FIG. 8E*

| CONFIGURATION | OPERATION | STATE | SUPPLY SWITCHES | | | | SIGNAL SWITCHES | | | |
|---|---|---|---|---|---|---|---|---|---|---|
| | | | S1 | S2 | S3 | S4 | S5 | S6 | S7 | S8 |
| 2X | NORMAL MODE | State A | A | B | B | A | B | C | D | A |
| | | State B | B | A | A | B | A | D | C | B |
| | DIAGNOSTIC MODE Ver. 1 | State A | A | A | B | B | B | C | C | B |
| | | State B | A | A | B | B | B | C | C | B |
| | DIAGNOSTIC MODE Ver. 2 | State A | A | A | B | B | B | C | C | B |
| | | State B | B | B | A | A | D | A | A | D |
| | DIAGNOSTIC MODE Ver. 3 | State A | A | A | B | B | B | C | C | B |
| | | State B | B | B | A | A | D | A | A | D |
| | DIAGNOSTIC MODE Ver. 4 | State A | A | A | B | B | B | C | C | B |
| | | State B | B | B | A | A | A | D | D | A |

FIG. 18

Normal Operation
Alternating between State A and B (chopping)

Diagnostics Operation
General Implementation
(fc ≠ fd)

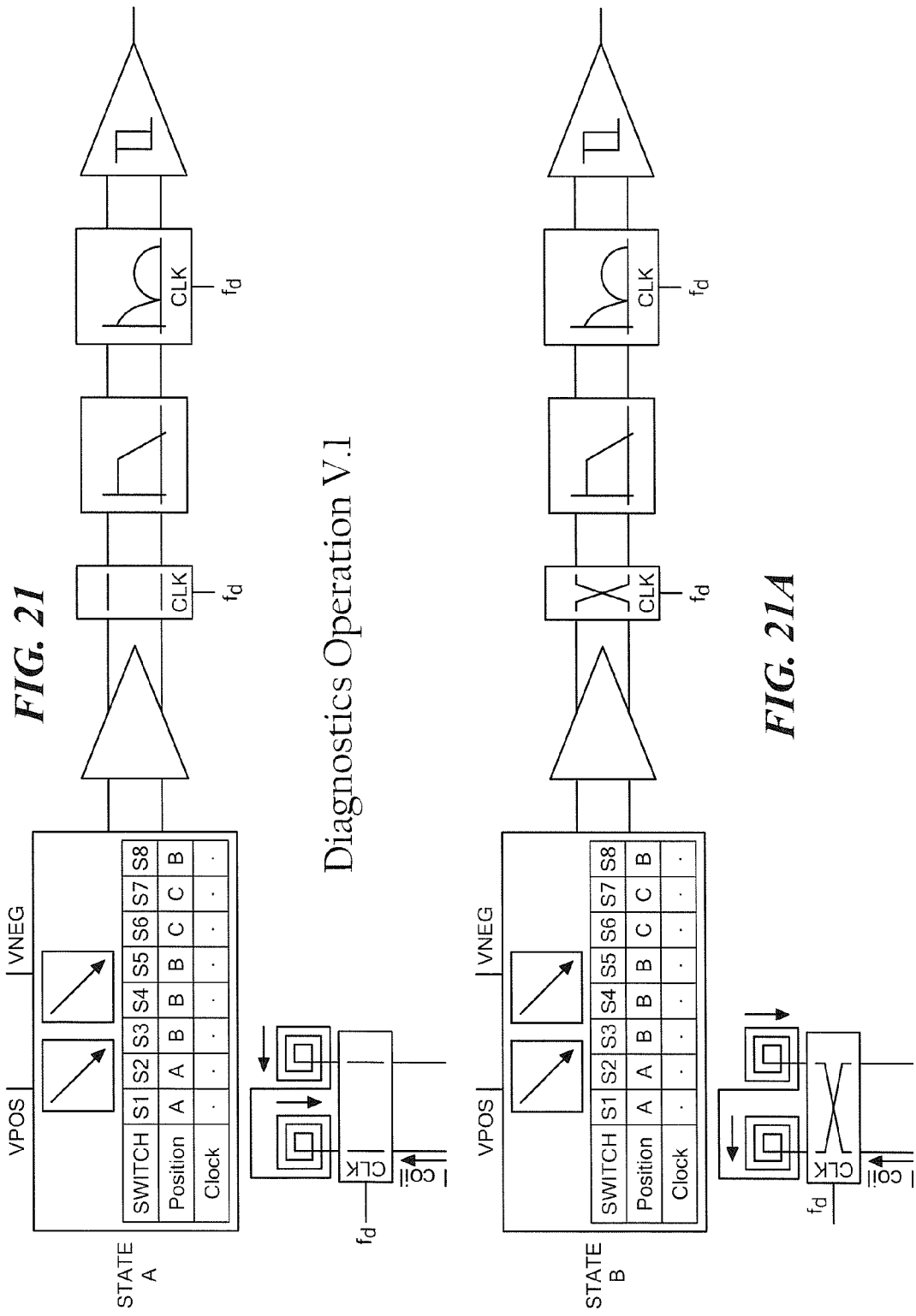

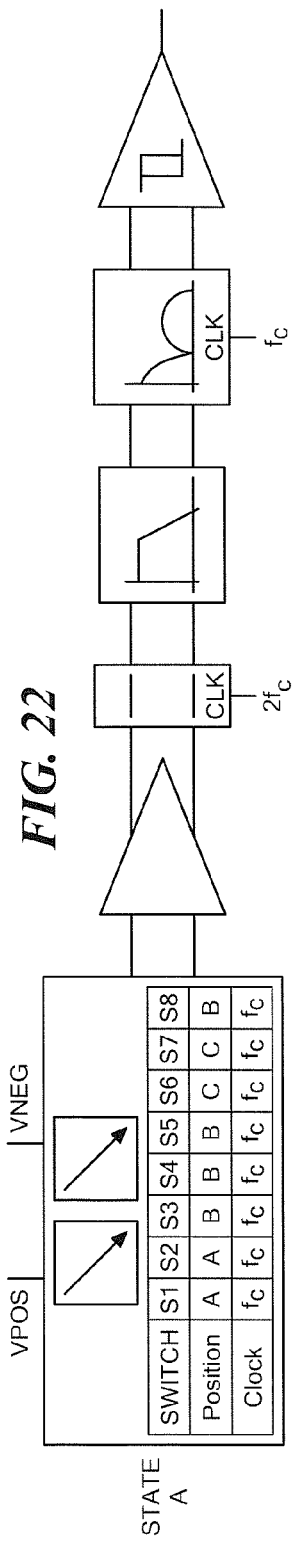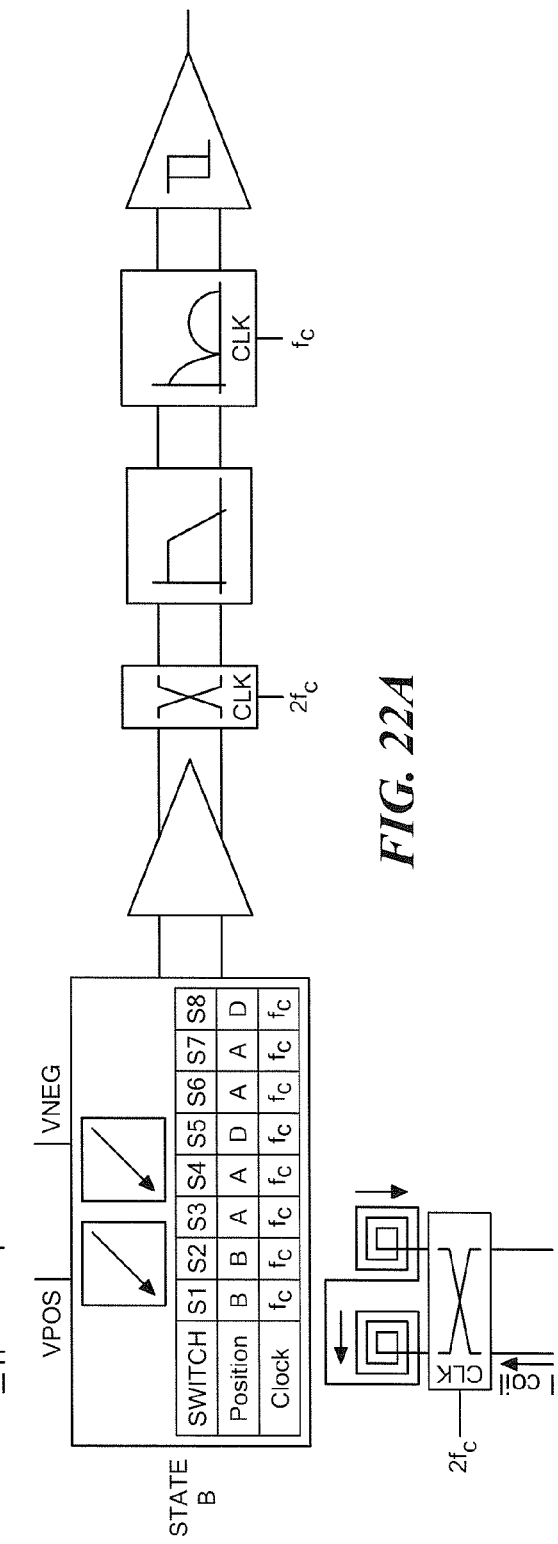
FIG. 22
FIG. 22A
Diagnostics Operation V.2
Increased Test Coverage Diagnostics Operation V.3
Increased Test Coverage

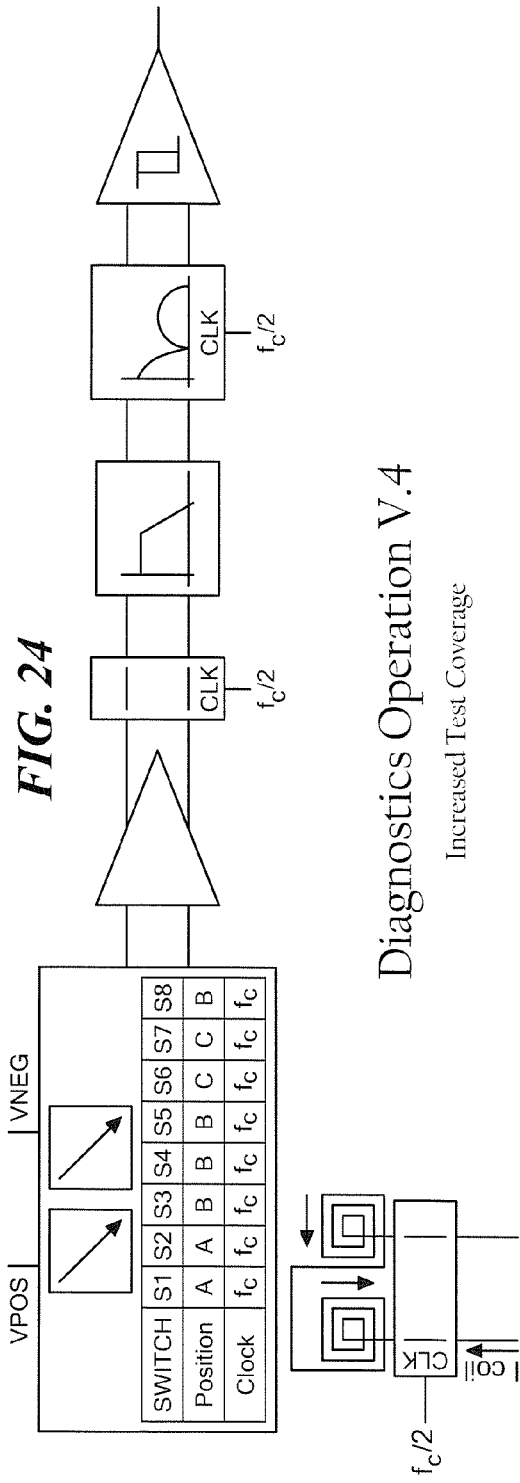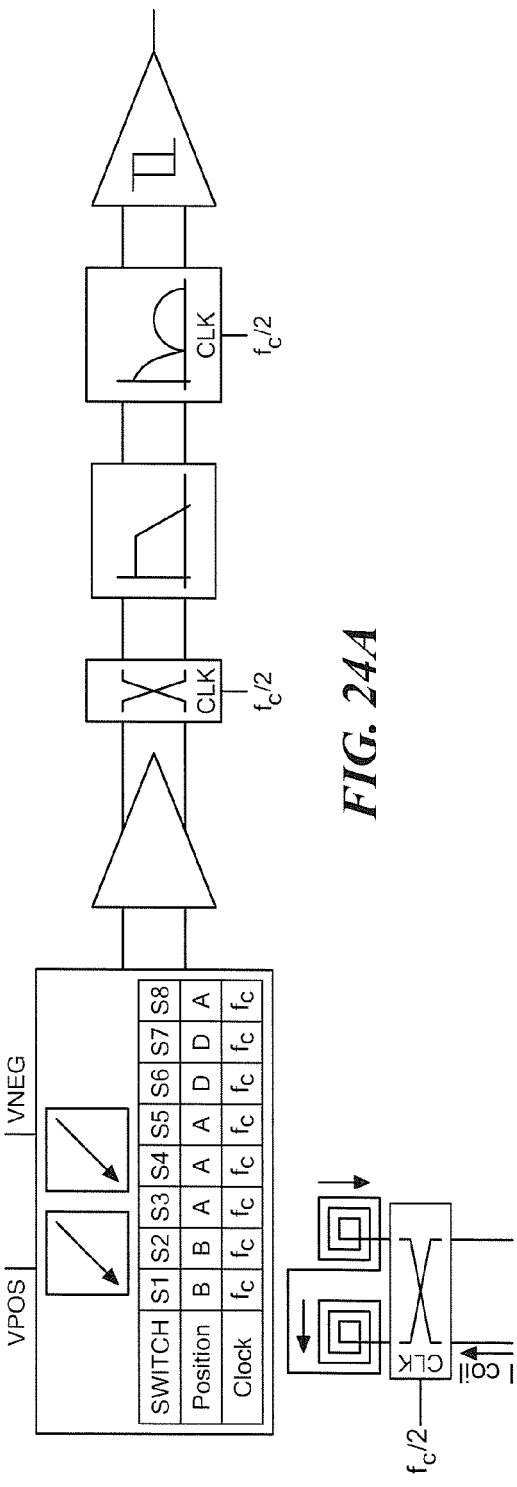

CIRCUITS AND METHODS FOR GENERATING A DIAGNOSTIC MODE OF OPERATION IN A MAGNETIC FIELD SENSOR

CROSS REFERENCE TO RELATED APPLICATIONS

This application claims the benefit under 35 U.S.C. §119 (e), of U.S. Provisional Application No. 61/227,628 filed Jul. 22, 2009 which application is hereby incorporated herein by reference in its entirety.

STATEMENT REGARDING FEDERALLY SPONSORED RESEARCH

Not Applicable.

FIELD OF THE INVENTION

This invention relates generally to magnetic field sensors and, more particularly, to magnetic field sensors having bother a normal mode of operation and a diagnostic mode of operation.

BACKGROUND OF THE INVENTION

As is known, there are a variety of types of magnetic field sensing elements, including, but not limited to, Hall effect elements, magnetoresistance elements, and magnetotransistors. As is also known, there are different types of Hall effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Magnetic switches are used as examples herein. However, the circuits and techniques described herein apply also to any magnetic field sensor.

As is known, some integrated circuits have internal built-in self-test (BIST) capabilities. A built-in self-test is a function that can verify all or a portion of the internal functionality of an integrated circuit. Some types of integrated circuits have built-in self-test circuits built directly onto the integrated circuit die. Typically, the built-in self-test is activated by external means, for example, a signal communicated from outside the integrated circuit to dedicated pins or ports on the integrated circuit. For example, an integrated circuit that has a memory portion can include a built-in self-test circuit, which can be activated by a self-test signal communicated from outside the integrated circuit. The built-in self-test circuit can test the memory portion of the integrated circuit in response to the self-test signal.

Conventional built-in self-test circuits used in magnetic field sensors tend not to test the magnetic field sensing element used in the magnetic field sensor. Conventional built-in self-test circuits also tend not to test all of the circuits with a magnetic field sensor.

It would be desireable to provide built in self-test circuits and techniques in a magnetic field sensor that allow the self-test function to test a magnetic field sensing element used within the magnetic field sensor. It would also be desireable to provide built in self-test circuits and techniques in a magnetic field sensor that allow the self-test all of the circuits within the magnetic field sensor. It would also be desirable to be able to perform the self-test regardless of a magnitude of an external magnetic field.

SUMMARY OF THE INVENTION

The present invention provides built-in self-test (diagnostic) circuits and techniques in a magnetic field sensor that allow the self-test to test a magnetic field sensing element used within the magnetic field sensor. The present invention provides built in self-test circuits and techniques in a magnetic field sensor that allow the self-test all of the circuits within the magnetic field sensor. The present invention also provides built in self-test circuits and techniques in a magnetic field sensor that are able to perform the self-test regardless of a magnitude of an external magnetic field.

In accordance with one aspect of the present invention, a magnetic field sensor includes at least two magnetic field sensing elements. The magnetic field sensor also includes a switching circuit coupled to the at least two magnetic field sensing elements. The switching circuit is configured to couple the at least two magnetic field sensing elements into a normal mode configuration when the magnetic field sensor is in a normal mode of operation, and the switching circuit is configured to couple the at least two magnetic field sensing elements into a diagnostic mode configuration when the magnetic field sensor is in a diagnostic mode of operation. The at least two magnetic field sensing elements are configured to generate a magnetic field signal including a measured-magnetic-field-responsive signal portion responsive to a measured magnetic field when coupled in the normal mode configuration, and a diagnostic-magnetic-field-responsive signal portion responsive to a diagnostic magnetic field when coupled in the diagnostic mode configuration.

In accordance with another aspect of the present invention, a method of generating a self-test of a magnetic field sensor includes coupling at least two magnetic field sensing elements into a normal mode configuration when the magnetic field sensor is in a normal mode of operation, and coupling the at least two magnetic field sensing elements into a diagnostic mode configuration when the magnetic field sensor is in a diagnostic mode of operation. The at least two magnetic field sensing elements are configured to generate a magnetic field signal including a measured-magnetic-field-responsive signal portion responsive to a measured magnetic field when coupled in the normal mode configuration, and a diagnostic-magnetic-field-responsive signal portion responsive to a diagnostic magnetic field when coupled in the diagnostic mode configuration.

BRIEF DESCRIPTION OF THE DRAWINGS

The foregoing features of the invention, as well as the invention itself may be more fully understood from the following detailed description of the drawings, in which:

FIG. 1 is a block diagram of a prior art magnetic field sensor, and, in particular a magnetic switch that has a chopped (or switched) Hall effect element, and an associated switching circuit;

FIG. 1A is a series of graphs showing frequency spectrums at various points in the prior at magnetic field sensor of FIG. 1;

FIG. 8D is a block diagram of the magnetic field sensor of FIGS. 7, 8, and 8B, and, in particular, the magnetic switch that has the two Hall effect elements but reconfigured so as to be in the diagnostic mode configuration of FIG. 6 or 6A, and including the two coils for generating the diagnostic magnetic fields in opposite directions as indicated in FIG. 6A, all operating in a third version diagnostic mode of operation;

FIG. 8E is a series of graphs showing frequency spectrums of signals at various points in the magnetic field sensor of FIG. 8D;

FIG. 18 is a chart showing switch positions of FIG. 17 in the normal mode of operation represented by of FIG. 7, the first version diagnostic mode of operation represented by FIGS. 8 and 8A, the second version diagnostic mode of operation represented by FIGS. 8B and 8C, the third version diagnostic mode of operation represented by FIGS. 8D and 8E, and the fourth version diagnostic mode of operation represented by FIGS. 8F and 8G;

FIGS. 21 and 21A are schematic diagrams showing the circuit of FIG. 8 showing switch positions of FIG. 17 used in the first version diagnostic mode of operation;

FIGS. 22 and 22A are schematic diagrams showing the circuit of FIG. 8B showing switch positions of FIG. 17 used in the second version diagnostic mode of operation;

FIGS. 24 and 24A are schematic diagrams showing the circuit of FIG. 8F showing switch positions of FIG. 17 used in the fourth version diagnostic mode of operation.

DETAILED DESCRIPTION OF THE INVENTION

Figure 2:
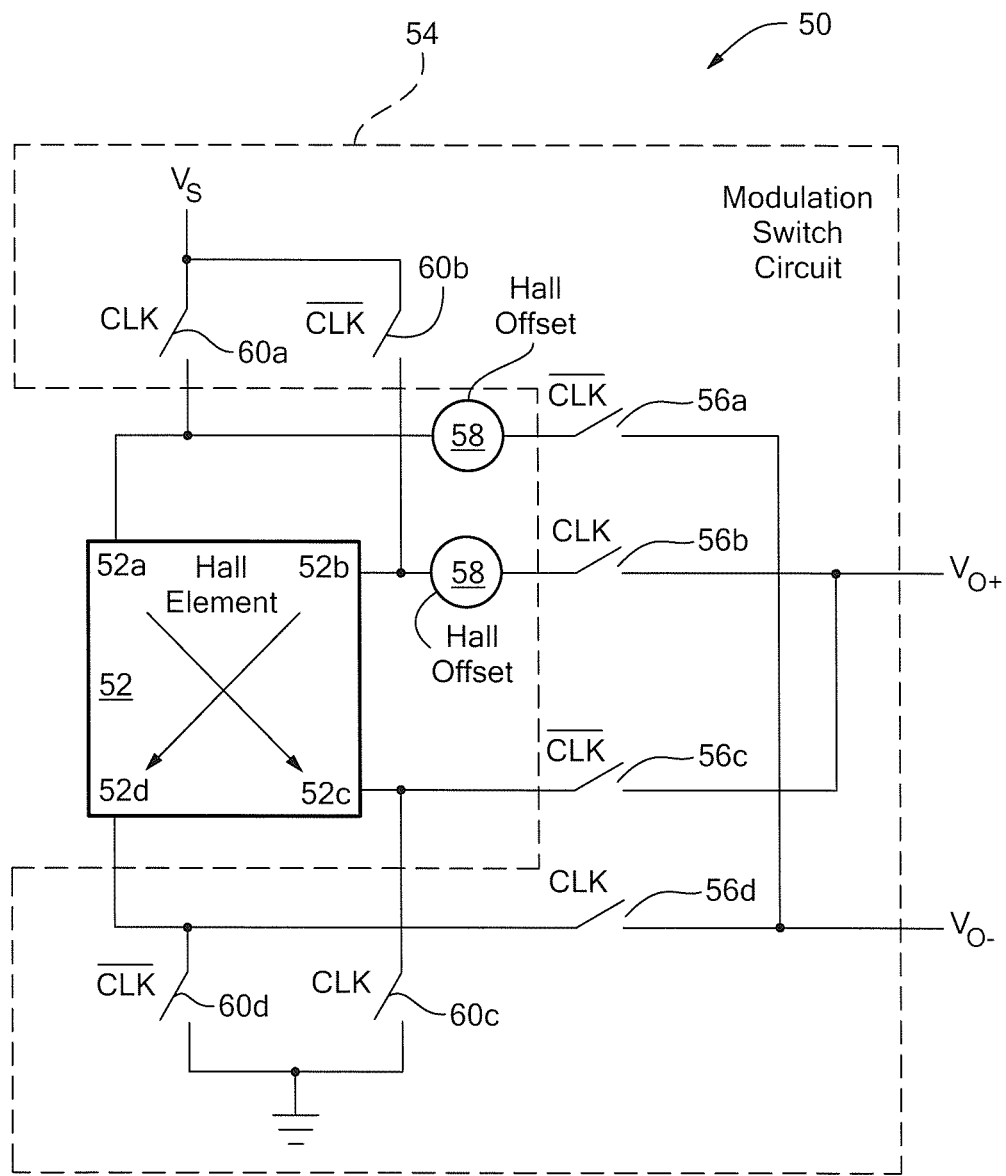
FIG. 2 is a block diagram showing a switched Hall element having a Hall effect element and having a switching circuit that can be used as the Hall effect element and the switching circuit of the magnetic field sensor of FIG. 1, and also as the Hall effect element and the switching circuit of magnetic field sensors below.

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall effect elements, magnetoresistance elements, or magnetotransistors. As is known, there are different types of Hall effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tends to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Magnetic switches (proximity detectors) are used as examples herein. However, the circuits and techniques described herein apply also to any magnetic field sensor capable of detecting a magnetic field.

As used herein, the term "magnetic field signal" is used to describe any circuit signal that results from a magnetic field experienced by a magnetic field sensing element.

Diagnostic modes of operation described below are generally indicative of a functioning versus a non-functioning magnetic field sensor. Namely, if no output signal is generated during a diagnostic mode of operation (or, in the case of a linear magnetic field sensor, the output signal is too low or too high), the magnetic field sensor is deemed to have failed. However, while diagnostic modes of operation are described below that are indicative of a functioning versus a non-functioning magnetic field sensor, it should be appreciated that similar techniques can be used to measure a sensitivity of the magnetic field sensor or to perform a calibration of the magnetic field sensor. Thus, as used herein, the term "diagnostic" is used to encompass sensitivity measurement and calibration.

Referring to FIG. 1, a prior art magnetic field sensor 10 includes a Hall effect element 13 coupled within a switching circuit 12. The switching circuit 12 is configured to generate a differential output signal 12a, 12b responsive to an external magnetic field. Many signals described below can be differential signals, however, the term differential is not used in all instances. In other embodiments, some or all of the signals are single ended signals.

The switching circuit 12 is more fully described below in conjunction with FIGS. 3-3C. Let it suffice here to say that the switching circuit 12 switches a drive signal (not shown) to the Hall effect element 12 with a clock at a frequency of $f_c$.

The magnetic field sensor 10 also includes a switching circuit 14 coupled to receive the signal 12a, 12b and configured to generate a chopped signal 14a, 14b. The switching circuit 14 is also switched with the clock at a frequency of $f_c$. Operation of the switching circuit 14 is also described more fully below in conjunction with FIGS. 3-3C.

An amplifier 16 is coupled to receive the chopped signal 14a, 14b and configured to generate an amplified signal 16a, 16b. A switching circuit 18 is coupled to receive the amplified signal 16a, 16b and configured to generate a demultiplexed signal 18a, 18b. The switching circuit 18 is clocked with the clock at the frequency, $f_c$. A low pass filter 20 is coupled to receive the demultiplexed signal 18a, 18b and configured to generate a filtered signal 20a, 20b. A sinx/x (sine) filter 22 is coupled to receive the filtered signal 20a, 20b and configured to generate a filtered signal 22a, 22b. A comparator 24, here a Schmitt trigger 24, is coupled to receive the filtered signal 22a, 22b and configured to generate a magnetic field sensor output signal 24a.

In some embodiments, the sine filter 22 is a switched capacitor filter having a first notch at a frequency $f_c$. However, in other embodiments, the sine filter 22 is generated digitally. In still other embodiments, the sine filter 22 is an analog unclocked filter.

It will be understood that clock frequency provided to the sine filter 22 can be at a frequency of $f_c$ as shown to provide the notch at the frequency $f_c$. However, it will also be understood that the sine filter 22 can be designed to have the notch at the frequency $f_c$ but using a clock signal at a different frequency. In conjunction with figures below (e.g., FIGS. 7-8G), the clock provided to the sine filter 22 is described to be at the frequency $f_c$. However, it is the notch frequency at the frequency $f_c$ that is desired.

It will be understood that the magnetic field sensor output signal 24a is a two state signal and that the magnetic field sensor 10 is a magnetic switch. However, in other embodiments, the comparator 24 is replaced by a linear amplifier or buffer, and the magnetic field output signal is a linear signal. It will also be understood that, in some embodiments, only one of the filters 20, 22 is used.

Operation of the magnetic field sensor of FIG. 1 is described below in conjunction with FIG. 1A.

Referring now to FIG. 1A, graphs 26 each include a horizontal axis having units of frequency in arbitrary units and a vertical axis having units of power in arbitrary units.

A graph 28 is representative of the signal 12a, 12b, (i.e., frequency spectra of the signal 12a, 12b) and shows an external magnetic field signal, Bexternal, plus a residual offset signal, ResOff, appearing a frequency, which can be a zero frequency indicative of a DC external magnetic field. A Hall effect offset signal, HallOff, is at a different frequency, according to a frequency of the clock, $f_c$. This effect is further described in conjunction with FIGS. 3-3C.

The Hall effect offset signal, HallOff, corresponds to a DC voltage error that would be present in the output signal 12a, 12b of the Hall effect element 13, but when the switching circuit 12 is not switching, i.e., when the current through the Hall effect elements 104, 106 is directed in one particular respective direction. As shown in the graph 28, the Hall effect offset signal, HallOff, is shifted to a higher frequency in the differential signal 12a, 12b by switching operation of the switching circuit 12 (and is shifted back to DC by operation of the switch circuit 14, as described below in conjunction with graph 30). The residual offset signal, ResOff, corresponds to a remaining offset signal that remains at DC in the differential signal 12a, 12b even when the switching circuit 12 is switching (and is shifted to a higher frequency by operation of the switching circuit 14, as described below in conjunction with graph 30).

A graph 30 is representative of the signal 14a, 14b, after chopping. The Hall offset signal, HallOff, is shifted to DC by operation of the switching circuit 14, and the signal Bexternal+ResOff is at the frequency $f_c$.

A graph 32 is representative of the signal 16a, 16b. In the graph 32, a DC offset of the amplifier 16 is added to the Hall offset signal at DC resulting in a signal HallOff+AmpOff at DC.

A graph 34 is representative of the signal 18a, 18b, after the switching circuit 18. As can be seen, the signal Bexternal+ResOff is now at DC and the signal HallOff+AmpOff is now at the frequency, $f_c$.

A graph 36 is representative of the signals 20a, 20b after the filter 20. A break frequency of the filter 20 is selected to be below the frequency, $f_c$. The signal HallOff+AmpOff is reduced, as is desired.

A graph 38 is representative of the signal 22a, 22b, after the sine filter 22. The notch of the sinc filter 22 is selected to be at the frequency, $f_c$, i.e., at a Nyquist frequency of the sinc filter 22. Only the external magnetic field signal (plus some residual offset) remains in the graph 38 and in the signal 22a, 22b. The Hall effect element offset (HallOff) has been removed.

Figure 2A:
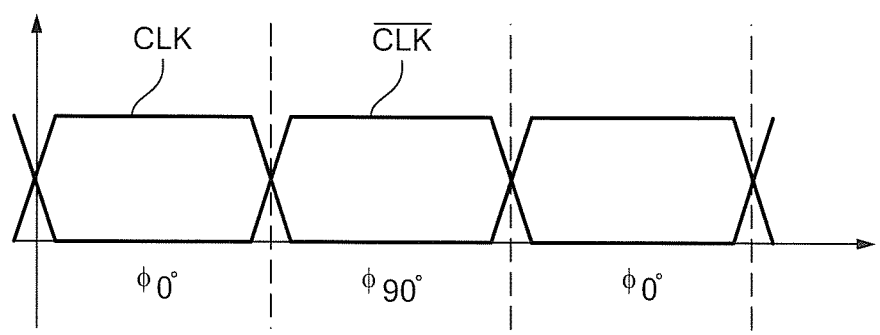
FIG. 2A is a graph showing clock signals for the switched Hall element of FIG. 2.
Figure 2B:
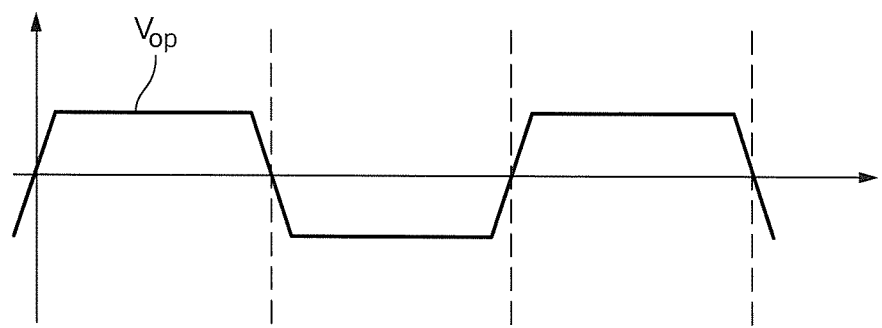
FIG. 2B is a graph showing a modulated offset component provided by the switched Hall element of FIG. 2.
Figure 2C:
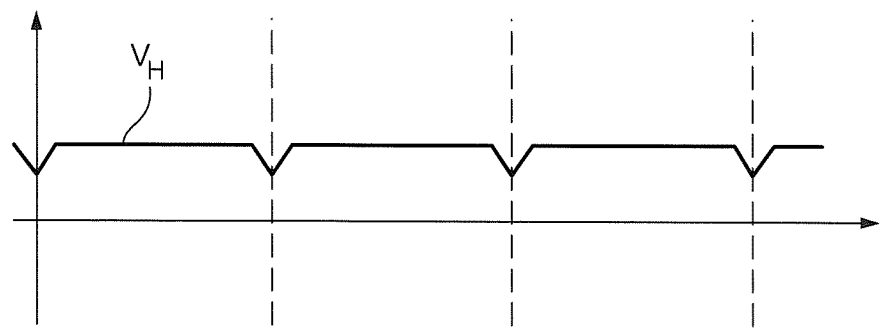
FIG. 2C is a graph showing an un-modulated magnetic field signal component provided by the switched Hall element of FIG. 2.

Referring now to FIGS. 2-2C, a switched Hall element 50 of a type that modulates a Hall offset component (e.g., 58) includes a Hall element (or Hall plate) 52 and a modulation circuit 54. The Hall element 52 includes four contacts 52a, 52b, 52c, and 52d, each coupled to a first terminal of a respective switch 56a, 56b, 56c, and 56d, as shown. Second terminals of switches 56b and 56c are coupled to provide a positive node of a switched Hall output signal, here labeled Vo+, and second terminals of switches 56a and 56d are coupled to provide a negative node of the switched Hall output signal, here labeled Vo−.

Additional switches 60a, 60b, 60c, and 60d are arranged to selectively couple the Hall contacts 52a, 52b, 52c, 52d to the supply voltage, Vs, and ground. More particularly, switches 56b, 56d, 60a, and 60c are controlled by a clock signal, CLK, and switches 56a, 56c, 60b, and 60d are controlled by a complementary clock signal, CLK/, as shown. The clock signals CLK and CLK/have two states or phases, a $\Phi_0°$ state and a $\Phi_{90}°$ state, as shown in FIG. 2A.

In operation, during phase $\Phi_0°$, current flows from the terminal 52a to the terminal 52c and the switched Hall output signal, Vo, is equal to $V_H+V_{op}$, where $V_{op}$ is the Hall element offset voltage or Hall offset component and $V_H$ is the magnetic field signal component. During the phase $\Phi_{90}°$, current flows from the terminal 52b to the terminal 52d and the switched Hall output signal, Vo, is equal to $V_H-V_{op}$. Thus, the modulation circuit 54 modulates the Hall offset component, $V_{op}$, which is shown in FIG. 2B for a zero Gauss magnetic field. The magnetic field signal component, $V_H$, remains substantially invariant, as shown in FIG. 2C.

The chopping circuit 50 of FIG. 2 can be used as the switching circuits 12, 14 of FIG. 1, however, the graphs 26 of FIG. 1 are representative of operation of the chopping circuit described below in conjunction with FIGS. 3-3C.

Figure 3:
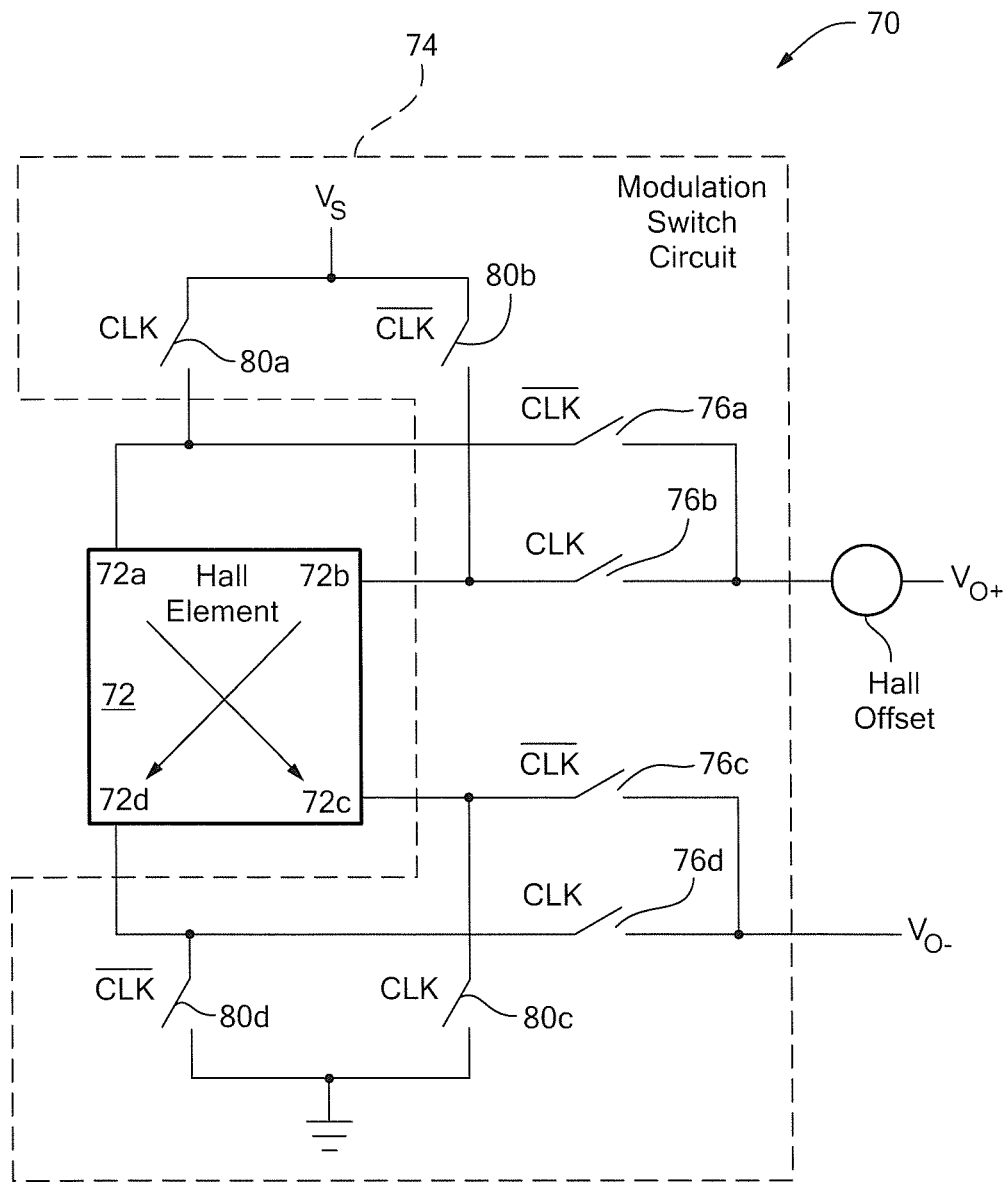
FIG. 3 is a block diagram showing a switched Hall element having a Hall effect element and having a switching circuit that can be used as the Hall effect element and the switching circuit in the sensor of FIG. 1, and also as the Hall effect element and the switching circuit of magnetic field sensors below.
Figure 3A:
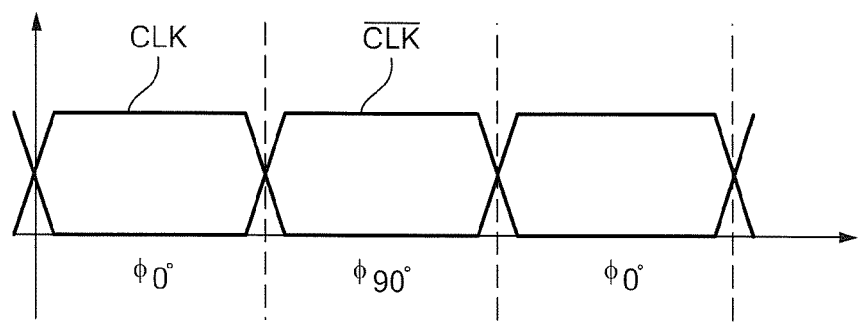
FIG. 3A is a graph showing clock signals for the switched Hall element of FIG. 3.
Figure 3B:
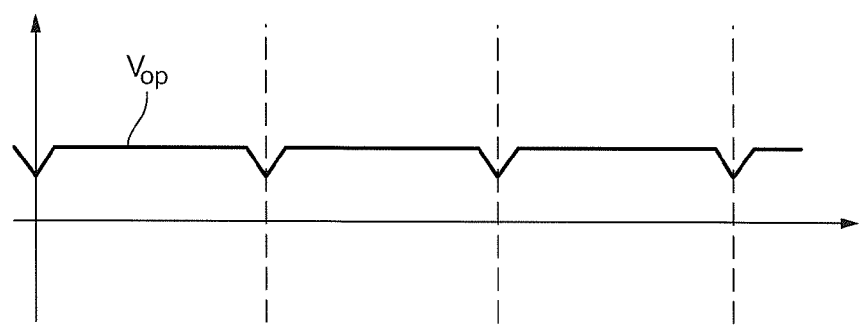
FIG. 3B is a graph showing an un-modulated offset component provided by the switched Hall element of FIG. 3.
Figure 3C:
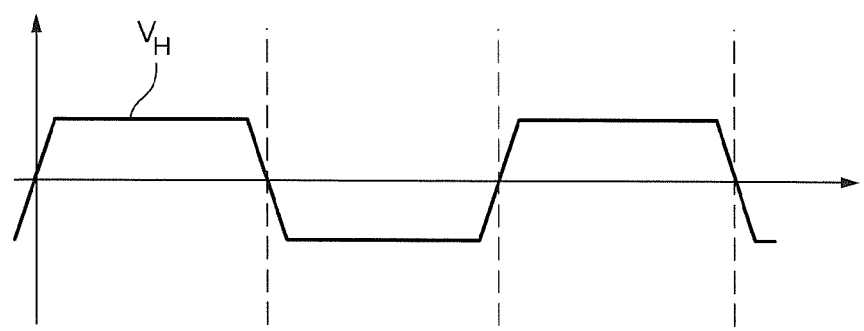
FIG. 3C is a graph showing a modulated magnetic field signal component provided by the switched Hall element of FIG. 3.

Referring now to FIGS. 3-3C, an alternative switched Hall element 70 of a type that modulates a magnetic field signal component (which can be used for the switching circuits 12, 14 of FIG. 1) includes a Hall element 72 and a modulation circuit 74. The Hall effect element 72 is the same as the Hall effect element 52 of FIG. 2 and includes four contacts 72a, 72b, 72c, and 72d, each coupled to a first terminal of a respective switch 76a, 76b, 76c, and 76d. Second terminals of switches 76a and 76b are coupled to provide a positive node of a switched Hall output signal, here labeled Vo+, and second terminals of switches 56c and 56d are coupled to provide a negative node of the switched Hall output signal, here labeled Vo−. Thus, a comparison of FIGS. 2 and 3 reveals that the output contacts of the Hall element are interchanged during the $\Phi_{90}°$ phase.

Additional switches 80a, 80b, 80c, and 80d are arranged to selectively couple the Hall contacts 72a, 72b, 72c, and 72d to the supply voltage Vs and ground. Switches 76b, 76d, 80a, and 80c are controlled by clock signal, CLK, and switches 76a, 76c, 80b, and 80d are controlled by a complementary clock signal, CLK/, as shown. Clock signals, CLK and CLK/, are identical to like signals in FIG. 2 and thus have two states or phases, $\Phi_0°$ and $\Phi_{90}°$, as shown.

In operation, during phase $\Phi_0°$, current flows from the terminal 72a to the terminal 72c, and the switched Hall output signal, Vo, is equal to $V_H+V_{op}$. During phase $\Phi_{90}°$, current flows from the terminal 72b to the terminal 72d, and the switched Hall output signal, Vo, is equal to $-V_H+V_{op}$. Thus, the modulation circuit 74 modulates the magnetic signal component to provide a modulated magnetic signal component, $V_H$, which is shown in FIG. 3C for a zero Gauss magnetic field. The offset component, $V_{op}$ remains substantially invariant as is shown in FIG. 3B.

It will be understood that the switches 80a-80d can form a switching circuit the same as or similar to the switching circuit 12 of FIG. 1. It will also be understood that the switches 76a-76d can form a switching circuit the same as or similar to the switching circuit 14 of FIG. 1

In some embodiments, the combination of the switching circuit 12 and the switching circuit 14 of FIG. 1 is of a type described above in conjunction with FIGS. 3-3C, rather than of a type described above in conjunction with FIGS. 2-2C.

Figure 4:
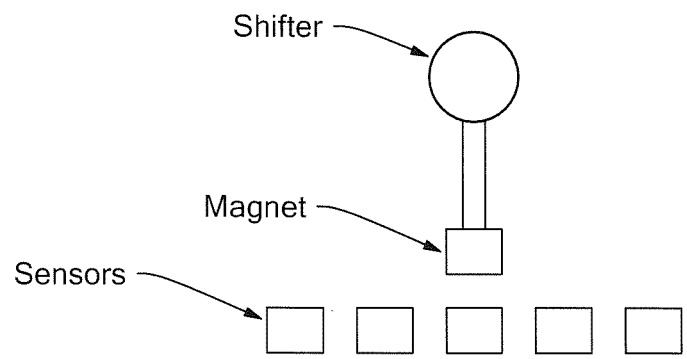
FIG. 4 is a pictorial showing a plurality of magnetic field sensor used in a gear shifting arrangement in an automobile.

Referring now to FIG. 4, a gear shifter can be disposed within an automobile. At the lower end of the gear shifter can be disposed a magnet. A plurality of magnetic field sensors can be disposed at positions to sense the position, and therefore, the selected gear, of the gear shifter.

It would be desirable to provide the magnetic field sensors with a self-test capability so that a computer system in the automobile can, from time to time, test the magnetic field sensors. In some embodiments, a failed magnetic field sensor can be reported to an operator of the automobile or to a mechanic by way of an indicator light or by way of a computer interface, for example an OBD-II computer interface, which is already present in automobiles sold in the U.S. since about 1996, but presently without such an indication of a failed magnetic field sensor associated with a gear shifter.

Figure 5:
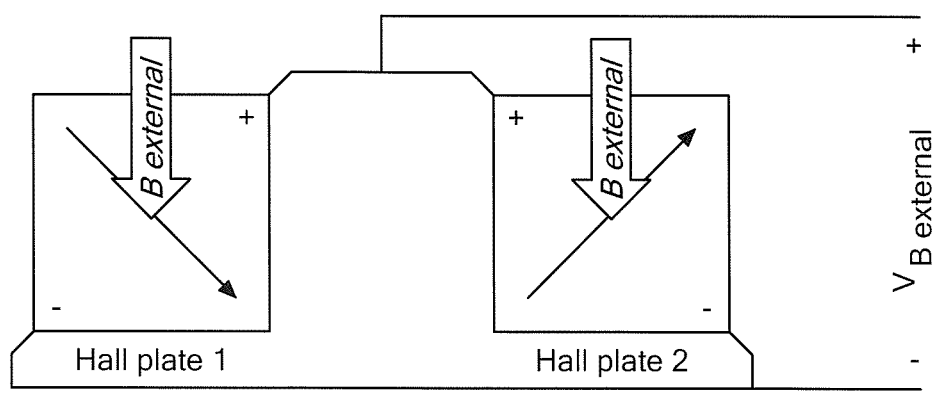
FIG. 5 is a block diagram showing two Hall effect elements arranged in parallel in a normal mode configuration, which would tend to respond in cooperation in the presence of an external magnetic field.

Referring now to FIG. 5, two Hall effect elements can be coupled together in parallel. The two Hall effect elements coupled in parallel can be used in place of any of the single Hall effect elements described above in conjunction with FIGS. 1-3C. Thus, the output (plus an minus) of the two parallel Hall effect elements can be used in place of a plus and minus output from one Hall effect element. Drive signals (not shown in FIG. 5) can drive the two parallel Hall effect elements just as they drive the one Hall effect element in any of the above figures.

The parallel arrangement of Hall effect elements is referred to herein as a normal mode configuration, as opposed to a diagnostic mode configuration described more fully below.

Figure 6:
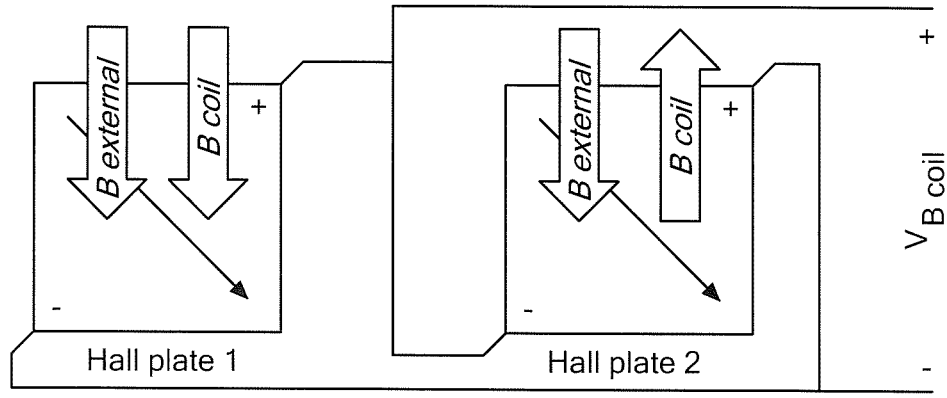
FIG. 6 is a block diagram showing the two Hall effect elements of FIG. 5, reconnected so as to be in a diagnostic mode configuration, and in the presence of the external magnetic field of FIG. 5 and also in the presence of a two diagnostic magnetic fields as may be generated in two opposite directions, e.g., by two respective coils.

Referring now to FIG. 6, the two Hall effect elements of FIG. 5 can be coupled together (i.e., re-connected) in a diagnostic mode configuration. With this arrangement, it should be understood that the combination of the two Hall effect elements arranged in the diagnostic mode configuration, is substantially unresponsive to an external magnetic field, Bexternal, in the same direction as experienced by each one of the two Hall effect elements. A residual response to the external magnetic field can be due to a mismatch of the two Hall effect elements, which would result in a residual external magnetic field signal.

However, it will also be understood that, in response to two diagnostic magnetic fields, Bcoil, in different directions as experienced by each one of the two Hall effect elements arranged in the diagnostic mode configuration, the combination of the two magnetic field sensing elements does generate an output signal, $V_{Bcoil}$.

Figure 6A:
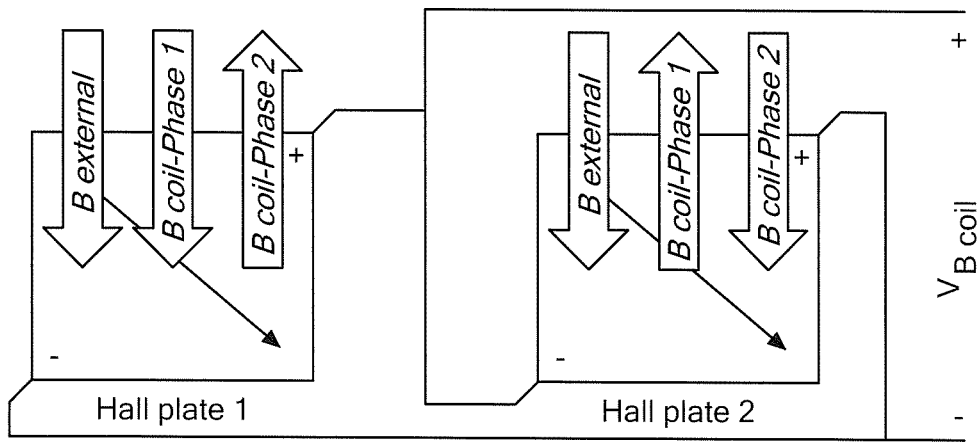
FIG. 6A is a block diagram showing the two Hall effect elements of FIG. 5, reconnected so as to be in the diagnostic mode configuration, and in the presence of the external magnetic field of FIG. 5, and also in the presence of a two diagnostic magnetic fields as may be generated in two opposite directions, e.g., by two respective coils, wherein the two diagnostic magnetic fields are AC magnetic fields.

Referring now to FIG. 6A, the two Hall effect elements are again shown arranged in the diagnostic mode configuration. Here, two phases (directions) of each of the two diagnostic magnetic fields, Bcoil, are shown. In essence, in response to an AC diagnostic field, the output signal, $V_{Bcoil}$, is an AC signal. However, when the two Hall effect elements are arranged in the diagnostic mode configuration, the output signal has substantially zero contribution from the external magnetic field, which is in the same direction at both Hall effect elements, regardless of whether the external magnetic field is a DC magnetic field or an AC magnetic field.

Referring to figures below, magnetic field sensors of FIGS. 7 8, 8B, 8D, and 8F are the same magnetic field sensor, but configured and operated in a normal mode of operation, a first version diagnostic mode of operation, a second version diagnostic mode of operation, a third version diagnostic mode of operation, and a fourth version diagnostic mode of operation, respectively. Accordingly, it will be recognized that circuit blocks of FIGS. 7 8, 8B, 8D, and 8F are the same, but at least some of the signals within the figures are not the same.

Figure 7:
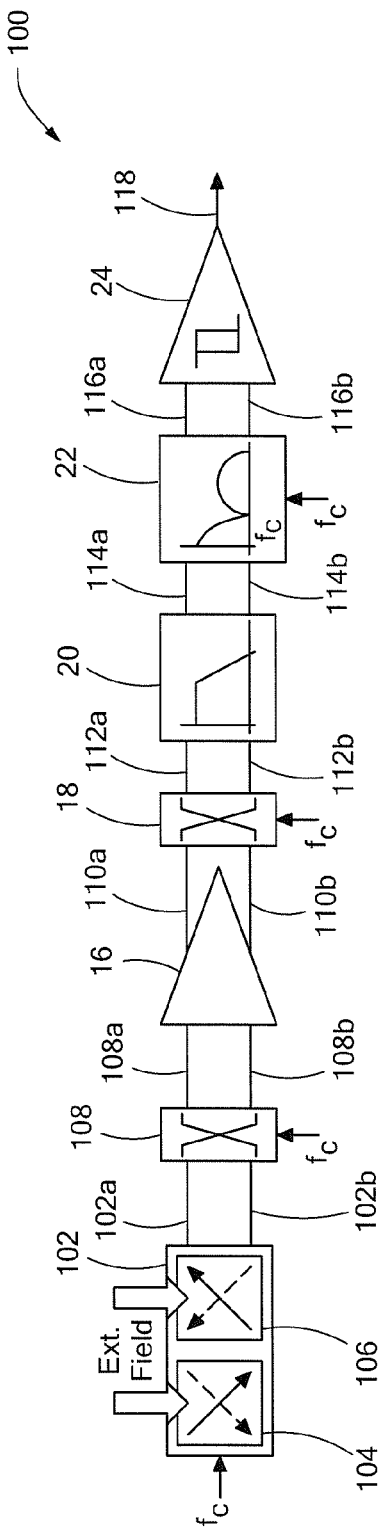
FIG. 7 is a block diagram of a magnetic field sensor, and, in particular, a magnetic switch that has two Hall effect elements coupled in parallel as in FIG. 5, which are together chopped (or switched) Hall effect elements, and an associated switching circuit, all operating in a normal mode of operation.

Referring now to FIG. 7, in which like elements of FIG. 1 are shown having like reference designations, in a normal mode of operation, a magnetic field sensor 100 can be like the magnetic field sensor 10 of FIG. 1, except that the magnetic field sensor 100 has two Hall effect elements 104, 106 arranged in a normal mode configuration, the same as shown above in FIG. 5.

The magnetic field sensor includes a switching circuit 102 coupled to the two Hall effect elements 104, 106 and configured to generate a differential output signal 102a, 102b. A switching circuit 108 is coupled to receive the signal 102a, 102b and configured to generate an output signal 108a, 108b.

The switching circuits 102 and 108 are more fully described below in conjunction with FIG. 17. Let it suffice here to say that the switching circuit 102 is configured to configure the two Hall elements 104, 106 into the normal mode configuration of FIG. 5, also to re-connect the two Hall effect elements 104, 106 into the diagnostic mode configuration of FIGS. 6 and 6A, and also configured, in some modes of operation, to switch a drive signal (not shown) to the Hall effect element 102, 104 with a clock at a frequency, resulting in a modulated (frequency shifted) signal. In the normal mode of operation, the drive signals to the two Hall effect elements 104, 106 are switched with a clock at a frequency of $f_c$. Let is also suffice here to say that the switching circuit 108 is representative of another modulation (or a demodulation) that can be generated by the same circuit as circuit 102 or by a different circuit. The switching circuit 108 is separately shown here for clarity.

Figure 17:
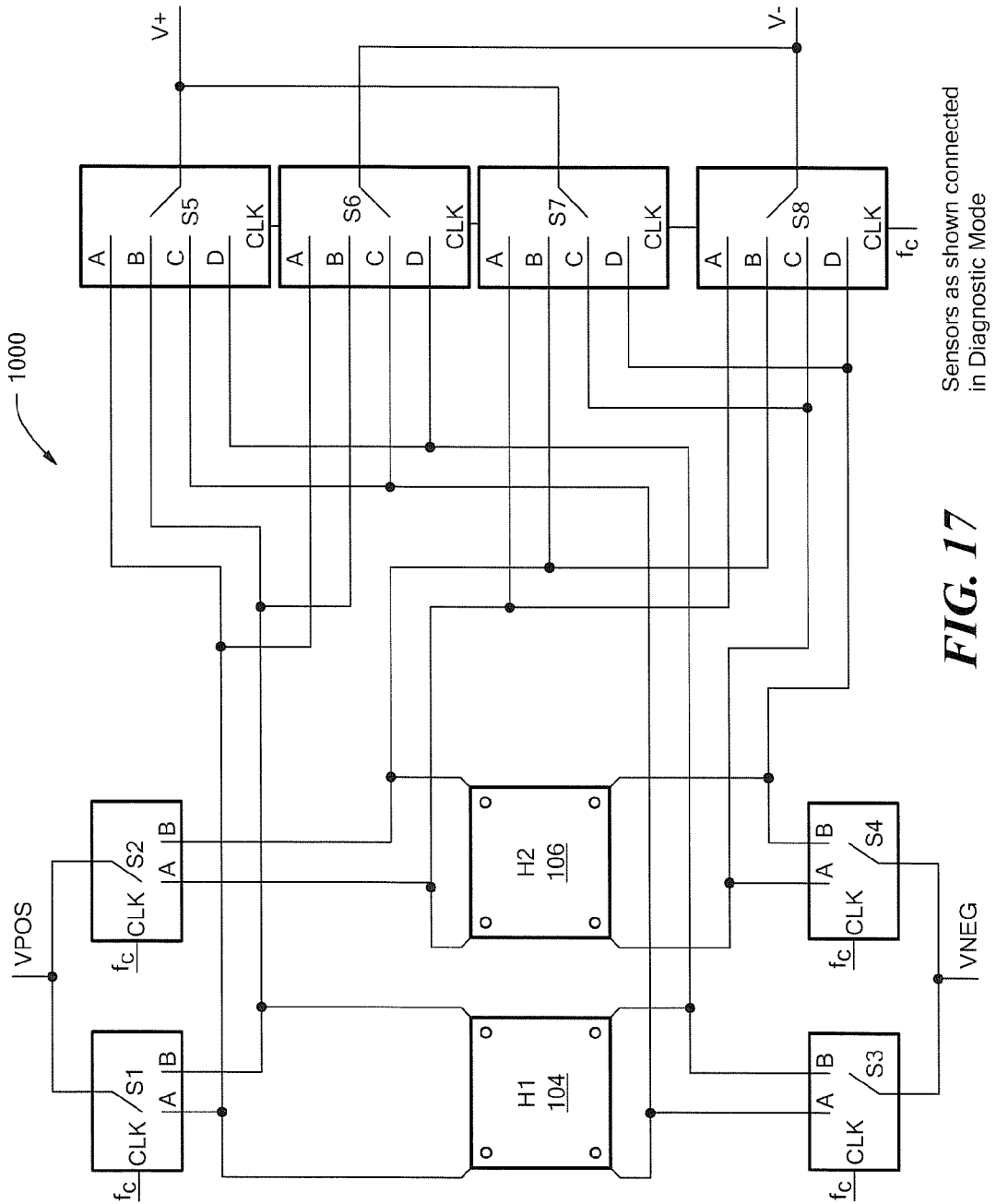
FIG. 17 is a schematic drawing showing two Hall effect elements and a switching arrangement that can achieve a reconfiguration from the normal mode configuration for FIG. 5 to the diagnostic mode configuration of FIGS. 6 of 6A.

It will be understood from FIG. 17, that the switching circuit 102 can be the same as or similar to the switching circuit 12 of FIG. 1. However, the switching circuit 102 allows for the two Hall effect elements 104, 106 to be connected into the normal mode configuration of FIG. 5 and re-connected into the diagnostic mode configuration of FIGS. 6, and 6A.

Two coils 124, 126 and a switching circuit 122 are not used in the normal mode of operation of FIG. 7, but are used in several forms of diagnostic mode of operation discussed below in conjunction with FIGS. 8-8G.

Compared to FIG. 1, signal 102a, 102b corresponds to the signal 12a, 12b, signal 108a, 108b corresponds to the signal 14a, 14b, signal 110a, 110b corresponds to the signal 16a, 16b, signal 112a, 112b corresponds to the signal 18a, 18b, signal 114a, 114b corresponds to the signal 20a, 20b, signal 116a, 116b corresponds to the signal 22a, 22b, and signal 118 corresponds to the signal 24a. Corresponding signals are essentially the same signals, except that in FIG. 7, the signals originate from two Hall effect elements 104, 106 rather than from the one Hall effect element 13.

In the circuits of FIGS. 7, 8, 8B, 8D, and 8F, various clock signals with various frequencies are shown and described. However, in all of the circuits, it will become apparent from discussion below that the notch frequency of the sine filter 22 is held constant at a frequency of $f_c$.

Figure 7A:
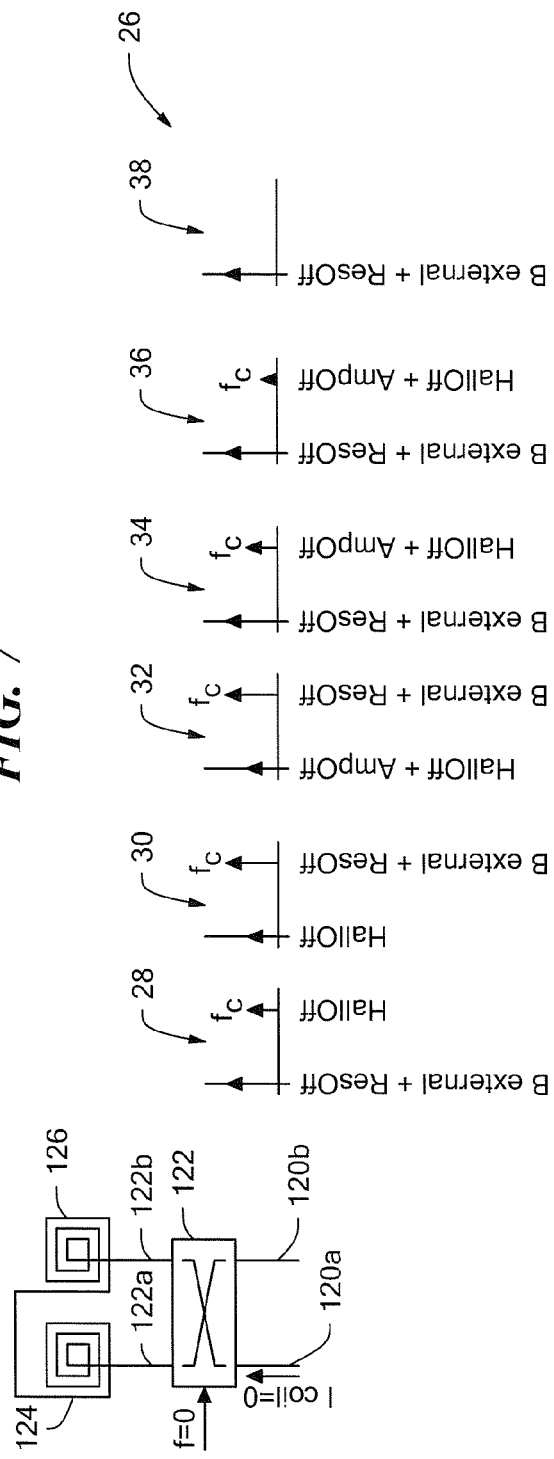
FIG. 7A is a series of graphs showing frequency spectrums of signals at various points in the magnetic field sensor of FIG. 7.

Referring now to FIG. 7A, in which like elements of FIG. 1A are shown having like reference designations, in the normal mode configuration, all signals are the same as described above in conjunction with FIG. 1A.

Compared to FIG. 1, the graph 28 corresponds to the signal 102a, 102b, the graph 30 corresponds to the signal 108a, 108b, the graph 32 corresponds to the signal 110a, 110b, the graph 34 corresponds to the signal 112a, 112b, the graph 36 corresponds to the signal 114a, 114b, and the graph 38 corresponds to the signal 116a, 116b.

In some embodiments, a current, Icoil, can be zero when in the normal mode configuration of FIG. 7. However, in some embodiments, the current, Icoil, is generated and switched by the switching circuit 122, even when in the normal mode configuration of FIG. 7. Referring to FIG. 5, it should be understood that, when the two Hall effect elements 104, 106 are in the normal mode configuration of FIG. 7 and exposed only to diagnostic magnetic fields in opposite directions, the output signal of the two Hall effect elements of FIGS. 5 and 7 is substantially zero. Thus, in some embodiments, the current, Icoil, is generated during both the normal mode of operation and during the diagnostic mode of operation described below.

Figure 8:
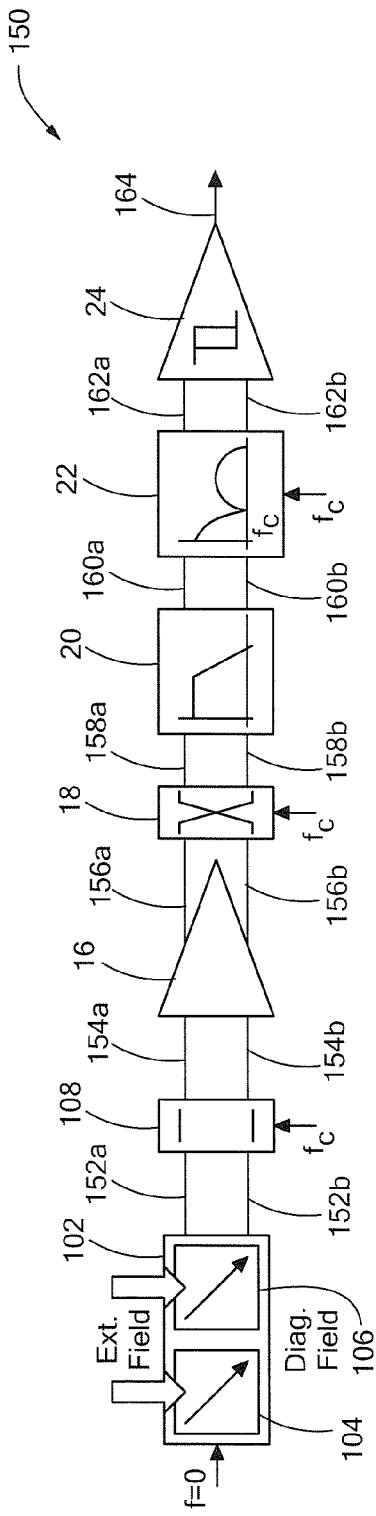
FIG. 8 is a block diagram of the magnetic field sensor of FIG. 7, and, in particular, the magnetic switch that has the two Hall effect elements but reconfigured so as to be in the diagnostic mode configuration of FIG. 6 or 6A, and including two coils for generating the diagnostic magnetic fields in opposite directions as indicated in FIG. 6A, all operating in a first version diagnostic mode of operation.

Referring now to FIG. 8, in which like elements of FIGS. 1 and 7 are shown having like reference designations, a magnetic field sensor 150 is the same as or similar to the magnetic field sensor 100 of FIG. 7, but is here shown with the two Hall effect elements 104, 106 re-connected into the diagnostic mode configuration described above in conjunction with FIGS. 6 and 6A. The switching circuit 102 can provide a re-connection of the Hall effect elements 104, 106 from the normal mode configuration of FIGS. 5 and 7 to the diagnostic mode configuration of FIGS. 6 and 6A.

The magnetic field sensor 150 is provided to describe the first version diagnostic mode of operation.

The magnetic field sensor 150 includes the two Hall effect elements 104, 106 coupled within the switching circuit 102. The switching circuit 102 is configured to generate a differential output signal 152a, 152b, which, unlike the signal 102a, 102b of FIG. 7, is responsive to a diagnostic magnetic field generated by the two coils 124, 126 and not responsive to an external magnetic field.

The switching circuit 102 is more fully described below in conjunction with FIG. 17. In operation of the magnetic field sensor 150 in the first version diagnostic mode of operation, let it suffice here to say that the switching circuit 102 is configured to reconfigure the two Hall elements 104, 106 into the diagnostic mode configuration of FIGS. 6 and 6A and configured not to switch a drive signal (not shown) to the Hall effect elements 102, 104, i.e., f=0.

Figure 8A:
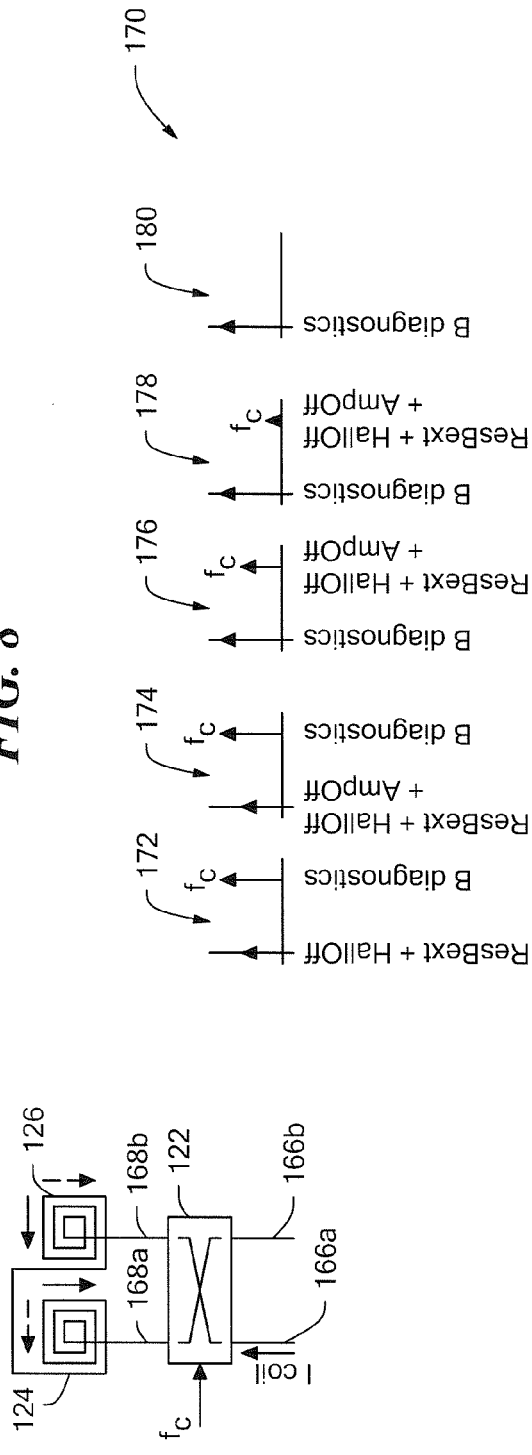
FIG. 8A is a series of graphs showing frequency spectrums of signals at various points in the magnetic field sensor of FIG. 8.

Signals 152a, 152b, 154a, 154b, 156a, 156b, 158a, 158b, 160a, 160b, 162a, 162b, and 164, described more fully below in conjunction with FIG. 8A, are different from the signals 102a, 102b, 104a, 104b, 106a, 106b, 108a, 108b, 110a, 110b, 112a, 112b, 114a, 114b, 116a, 116b, and 118 of FIG. 7, since the Hall effect elements 104, 106 are differently coupled in FIG. 8 than in FIG. 7, since the two Hall effect elements 104, 106 are responsive to diagnostic magnetic fields described more fully below and not responsive to the external magnetic field, and since the magnetic field sensor 150 operates in the first version diagnostic mode of operation.

The two diagnostic mode coils 124, 126 can be coupled to receive the current, Icoil, which, using a clock having a frequency of $f_c$, is switched back and forth in direction by the switching circuit 122 coupled between the two diagnostic mode coils 124, 126 and the coil current, Icoil.

The magnetic field sensor 150 is shown having a clocking arrangement indicative of the first version diagnostic mode of operation. In particular, in the first version diagnostic mode of operation, the switching circuit 122 and the switching circuit 18 are clocked with a clock having a frequency of $f_c$, and the sinc filter 22 has a notch at the frequency of $f_c$. However, the switching circuit 108 is not switched at all and is fixed to a predetermined configuration, merely passing the signal 152a, 152b through the switching circuit 108. Also, the switching circuit 102 is not switched, but merely provides the re-connection of the Hall effect elements from the normal mode configuration to the diagnostic mode configuration.

It will be appreciated that, when in the first version diagnostic mode of operation, the switching provided by the switching circuit 122 takes the place of the switching provided by the switching circuit 102 when in the normal mode of operation of FIG. 7. The first version diagnostic mode of operation is able to perform a self-test of all of the parts of the magnetic field sensor 150, except for operation of the switching circuit 108.

Referring now to FIG. 8A, graphs 170 each include a horizontal axis having units of frequency in arbitrary units and a vertical axis having units of power in arbitrary units.

A graph 172 is representative of the signal 152a, 152b, and also of the signal 154a, 154b, and shows the AC diagnostic magnetic field, Bdiagnostics, resulting from the two diagnostic coils 124, 126, appearing at a frequency, according to a frequency of the clock, $f_c$, which clocks the switching circuit 122. A Hall effect element offset signal, HallOff, summed with any residual signal due to the external magnetic field, ResBext, is at a different frequency, which can be zero. The signal, ResBext, can result from a mismatch in the two Hall effect elements 104, 106 when coupled in the diagnostic mode configuration of FIGS. 6 and 6A.

A graph 174 is representative of the signal 156a, 156b after the amplifier 16. The graph 174 is like the graph 172, except that an amplifier offset voltage, AmpOff, is added at DC.

A graph 176 is representative of the signal 158a, 158b, after the switching circuit 18. As can be seen, the diagnostic magnetic field signal, Bdiagnostics, is shifted to DC and the sum of the signals HallOff, ResBext, and AmpOff is now at the frequency, $f_c$, which is the clocking frequency of the switching circuit 18.

A graph 178 is representative of the signals 160a, 160b after the filter 20. A break frequency of the filter 20 is selected to be below the frequency, $f_c$. The residual offsets and the amplifier offset are reduced.

A graph 180 is representative of the signal 162a, 162b, after the sinc filter 22. The notch of the sinc filter 22 is selected to be at the frequency, $f_c$. Only the diagnostic magnetic field signal remains in the graph 180 and in the signal 162a, 162b.

Figure 8B:
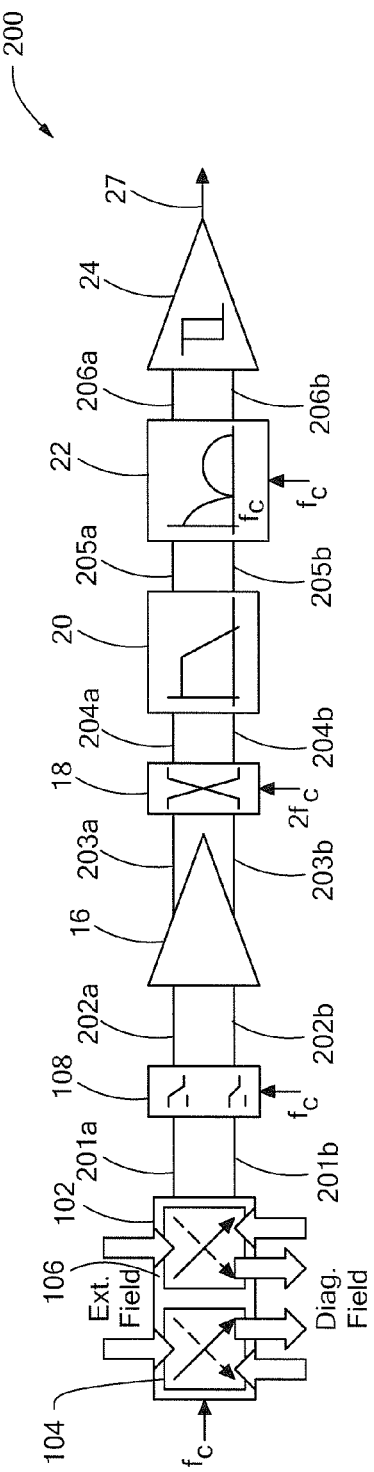
FIG. 8B is a block diagram of the magnetic field sensor of FIGS. 7 and 8, and, in particular, the magnetic switch that has the two Hall effect elements but reconfigured so as to be in the diagnostic mode configuration of FIG. 6 or 6A, and including the two coils for generating the diagnostic magnetic fields in opposite directions as indicated in FIG. 6A, all operating in a second version diagnostic mode of operation.

Referring now to FIG. 8B, in which like elements of FIGS. 1, 7, and 8 are shown having like reference designations, a magnetic field sensor 200 is the same as or similar to the magnetic field sensors 100, 150 of FIGS. 7 and 8. The two Hall effect elements 104, 106 are again re-connected, like in FIG. 8, into the diagnostic mode configuration described above in conjunction with FIGS. 6, 6A, by operation of the switching circuit 102.

The magnetic field sensor 200 is provided to describe the second version diagnostic mode of operation.

The magnetic field sensor 200 includes the two Hall effect elements 104, 106 coupled within the switching circuit 102. The switching circuit 102 is configured to switch a drive signal to the Hall effect elements 104, 106 to generate a differential output signal 201a, 201b, which, unlike the signal 102a, 102b of FIG. 7, is responsive to a diagnostic magnetic field generated by the two coils 124, 126 and not responsive to an external magnetic field. Also, unlike the signal 152a, 152b of FIG. 8, the differential signal 201a, 201b has different signal content due to different operation of the switching circuits 122, 102.

The switching circuit 102 is more fully described below in conjunction with FIG. 17. In operation of the magnetic field sensor 200 in the second version diagnostic mode of operation, let it suffice here to say that, like the magnetic field sensor 150 of FIG. 8, the switching circuit 102 is configured to re-connect the two Hall elements 104, 106 from the normal mode configuration of FIG. 5 to the diagnostic mode configuration of FIGS. 6 and 6A, but, unlike the magnetic field sensor 150 of FIG. 8, the switching circuit 102 is configured to switch a drive signal (not shown) to the Hall effect elements 102, 104 using a clock with a frequency of $f_c$.

Figure 8C:
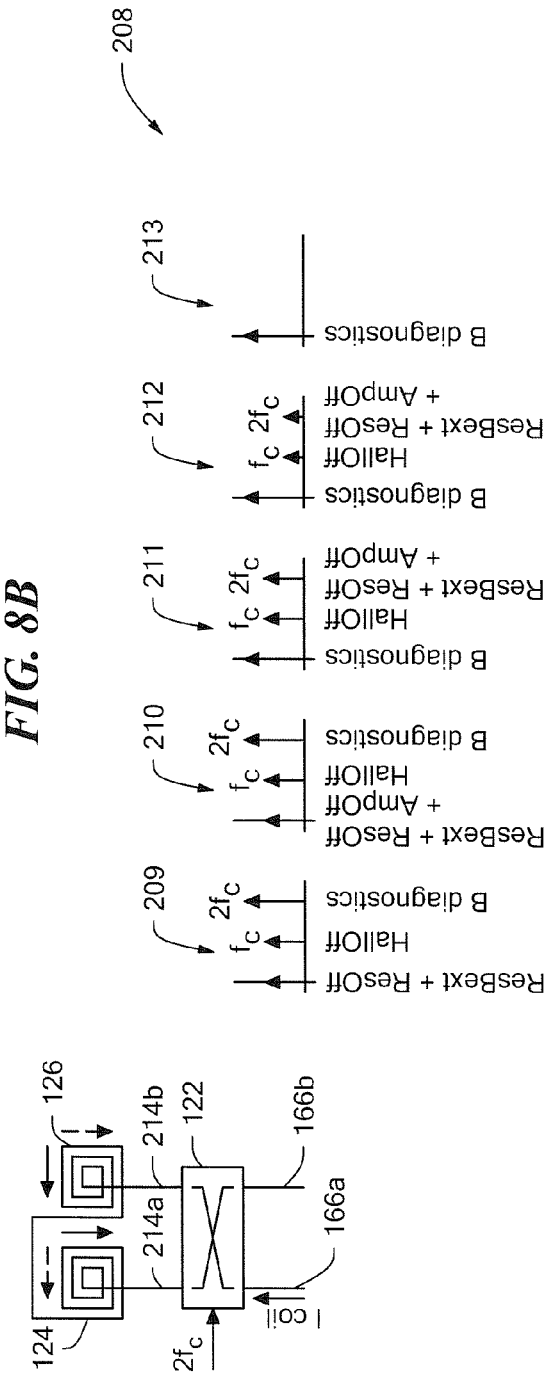
FIG. 8C is a series of graphs showing frequency spectrums of signals at various points in the magnetic field sensor of FIG. 8B.

Signals 201a, 201b, 202a, 202b, 203a, 203b, 204a, 204b, 205a, 205b, 206a, 206b, and 207, described more fully below in conjunction with FIG. 8C, are different from the signals 102a, 102b, 104a, 104b, 106a, 106b, 108a, 108b, 110a, 110b, 112a, 112b, 114a, 114b, 116a, 116b, and 118a of FIG. 7, and the signals 152a, 152b, 154a, 154b, 156a, 156b, 158a, 158b, 160a, 160b, 162a, 162b, and 164 of FIG. 8, since the magnetic field sensor 200 operates in the second version diagnostic mode of operation.

The two diagnostic mode coils 124, 126 can be coupled to receive the current, Icoil, which, using a clock having a frequency of $2f_c$, is switched back and forth in direction by the switching circuit 122 coupled between the two diagnostic mode coils 124, 126 and the coil current, Icoil.

The magnetic field sensor 200 is shown having a clocking arrangement indicative of the second version diagnostic mode of operation. In particular, in the second version diagnostic mode of operation, the switching circuit 122, and the switching circuit 18 are clocked with a clock having a frequency of $2f_c$, while the switching circuit 102 and the switching circuit 108, are clocked with a clock having a frequency of $f_c$, and the sinc filter 22 has a notch at the frequency of $f_c$.

The second version diagnostic mode of operation is able to perform a self-test of all of the parts of the magnetic field sensor 200, including operation of the switching circuits 102, 108.

Referring now to FIG. 8C, graphs 208 each include a horizontal axis having units of frequency in arbitrary units and a vertical axis having units of power in arbitrary units.

A graph 209 is representative of the differential signal 202a, 202b, and shows the AC diagnostic magnetic field, Bdiagnostics, resulting from the two diagnostic coils 124, 126, appearing at a frequency according to a frequency of the clock, $2f_c$, which clocks the switching circuit 122. The graph 209 also shows a spectral component corresponding to a Hall element offset voltage, HallOff, appearing at a frequency according to a frequency of the clock, $f_c$, which clocks the switching circuit 102. A Hall effect element residual offset signal, ResOff, summed with any residual signal due to the external magnetic field, ResBext, is at a different frequency, which can be zero. As described above, the signal, ResBext, can result from a mismatch in the two Hall effect elements 104, 106 when coupled in the diagnostic mode configuration of FIGS. 6 and 6A.

It will be appreciated that the switching circuit 108 does not operate to modulate the signal 201a, 201b in the second version diagnostic mode of operation. In other words, the switching circuit 108 does not shift any signal frequencies. In essence, when the switching circuit 102 switches the drive signal to the two Hall effect elements, the output signal from the two Hall effect elements reverses polarity. The switching circuit 108 switches the two differential output signal 201a, 201b going into the amplifier 16, resulting in a positive signal always going into the same node (e.g., positive input node) of the amplifier 16 and a negative signal always going into the same node (e.g., negative input node) of the amplifier 16. Thus, no frequency shift results from operation of the switching circuit 108 in the second version diagnostic mode of operation.

A graph 210 is representative of the signal 203a, 203b after the amplifier 16. The graph 210 is like the graph 209, except that an amplifier offset voltage, AmpOff, is added at DC.

A graph 211 is representative of the signal 204a, 204b, after the switching circuit 18. As can be seen, the diagnostic magnetic field signal, Bdiagnostics, is shifted to DC, the sum of the signals ResBext, ResOff, and AmpOff is now at the frequency, $2f_c$, and the signal HallOff remains at the frequency, $f_c$.

A graph 212 is representative of the signal 205a, 205b after the filter 20. A break frequency of the filter 20 is selected to be below the frequency, $f_c$. The residual offset signals, the amplifier offset signal, and the Hall element offset signal are reduced.

A graph 213 is representative of the signal 206a, 206b, after the sine filter 22. The notch of the sinc filter 22 is selected to be at the frequency, $f_c$. Only the diagnostic magnetic field signal remains in the graph 213 and in the signal 206a, 206b.

Referring now to FIG. 8D, in which like elements of FIGS. 1, 7, 8, and 8B are shown having like reference designations, a magnetic field sensor 220 is the same as or similar to the magnetic field sensors 100, 150, 200 of FIGS. 7, 8, and 8B, respectively. The two Hall effect elements 104, 106 are again re-connected, like in FIGS. 8 and 8B, into the diagnostic mode configuration described above in conjunction with FIGS. 6, 6A by operation of the switching circuit 102.

The magnetic field sensor 220 is provided to describe the third version diagnostic mode of operation.

The magnetic field sensor 220 includes the two Hall effect elements 104, 106 coupled within the switching circuit 102.

The switching circuit 102 is configured to switch a drive signal to the two Hall effect elements 104, 106 to generate a differential output signal 221a, 221b, which, unlike the signal 102a, 102b of FIG. 7, is responsive to a diagnostic magnetic field generated by the two coils 124, 126 and not responsive to an external magnetic field. Also, unlike the signal 152a, 152b of FIG. 8 and the signal 201a, 201b of FIG. 8B, the signal 221a, 221b has different signal content due to different operation of the switching circuits 122, 102.

The switching circuit 102 is more fully described below in conjunction with FIG. 17. In operation of the magnetic field sensor 220 in the third version diagnostic mode of operation, let it suffice here to say that, like the magnetic field sensors 150, 200 of FIGS. 8 and 8B, respectively, the switching circuit 102 is configured to re-connect the two Hall elements 104, 106 from the normal mode configuration of FIG. 5 into the diagnostic mode configuration of FIGS. 6 and 6A, but, unlike the magnetic field sensor 150 of FIG. 8, and unlike the magnetic field sensor 200 of FIG. 8B, the switching circuit 102 is configured to switch a drive signal (not shown) to the Hall effect elements 102, 104 using a clock with a frequency of $2f_c$.

Signals 221a, 221b, 222a, 222b, 223a, 223b, 224a, 224b, 225a, 225b, 226a, 226b, and 227, described more fully below in conjunction with FIG. 8E, are different from the signals 102a, 102b, 104a, 104b, 106a, 106b, 108a, 108b, 110a, 110b, 112a, 112b, 114a, 114b, 116a, 116b, and 118a of FIG. 7, the signals 152a, 152b, 154a, 154b, 156a, 156b, 158a, 158b, 160a, 160b, 162a, 162b, and 164 o FIG. 8, and the signals 201a, 201b, 202a, 202b, 203a, 203b, 204a, 204b, 205a, 205b, 206a, 206b, and 207 of FIG. 8B, since the magnetic field sensor 220 operates in the third version diagnostic mode of operation.

The two diagnostic mode coils 124, 126 can be coupled to receive the current, Icoil, which, using a clock having a frequency of $f_c$, is switched back and forth in direction by the switching circuit 122 coupled between the two diagnostic mode coils 124, 126 and the coil current, Icoil.

The magnetic field sensor 220 is shown having a clocking arrangement indicative of the third version diagnostic mode of operation. In particular, in the third version diagnostic mode of operation, the switching circuit 122 and the switching circuit 18 are clocked with a clock having a frequency of $f_c$, and the sine filter 22 has a notch at the frequency of $f_c$, while the switching circuit 102 and the switching circuit 108 are clocked with a clock having a frequency of $2f_c$.

The third version diagnostic mode of operation is able to perform a self-test of all of the parts of the magnetic field sensor 220, including operation of the switching circuits 102, 108.

Referring now to FIG. 8E, graphs 228 each include a horizontal axis having units of frequency in arbitrary units and a vertical axis having units of power in arbitrary units.

A graph 229 is representative of the signal 221a, 221b, and shows the AC diagnostic magnetic field, Bdiagnostics, resulting from the two diagnostic coils 124, 126, appearing at a frequency according to a frequency of the clock, $f_c$, which clocks the switching circuit 122. The graph 229 also shows a spectral component corresponding to a Hall element offset voltage, HallOff, appearing at a frequency according to a frequency of the clock, $2f_c$, which clocks the switching circuit 102. A Hall effect element residual offset signal, ResOff, summed with any residual signal due to the external magnetic field, ResBext, is at a different frequency, which can be zero. As described above, the signal, ResExt, can result from a mismatch in the two Hall effect elements 104, 106 when coupled in the diagnostic mode configuration of FIGS. 6 and 6A.

It will be appreciated that the switching circuit 108 does not operate to modulate the signal 221a, 221b in the third version diagnostic mode of operation, for reasons described above in conjunction with FIG. 8C.

A graph 230 is representative of the signal 223a, 223b after the amplifier 16. The graph 230 is like the graph 229, except that an amplifier offset voltage, AmpOff, is added at DC.

A graph 231 is representative of the signal 224a, 224b, after the switching circuit 18. As can be seen, the diagnostic magnetic field signal, Bdiagnostics, is shifted to DC, the sum of the signals ResBext, ResOff, and AmpOff is now at the frequency, $f_c$, and the signal HallOff remains at the frequency, $f_c$. A specific phase of the signal controlling the switching circuit 18 is needed for the previous to occur.

A graph 232 is representative of the signal 225a, 225b after the filter 20. A break frequency of the filter 20 is selected to be below the frequency, $f_c$. The residual offset signals, the amplifier offset signal, and the Hall element offset signal are reduced.

A graph 233 is representative of the signal 226a, 226b, after the sine filter 22. The notch of the filter 22 is selected to be at the frequency, $f_c$. Only the diagnostic magnetic field signal remains in the graph 233 and in the signal 226a, 226b.

Figure 8F:
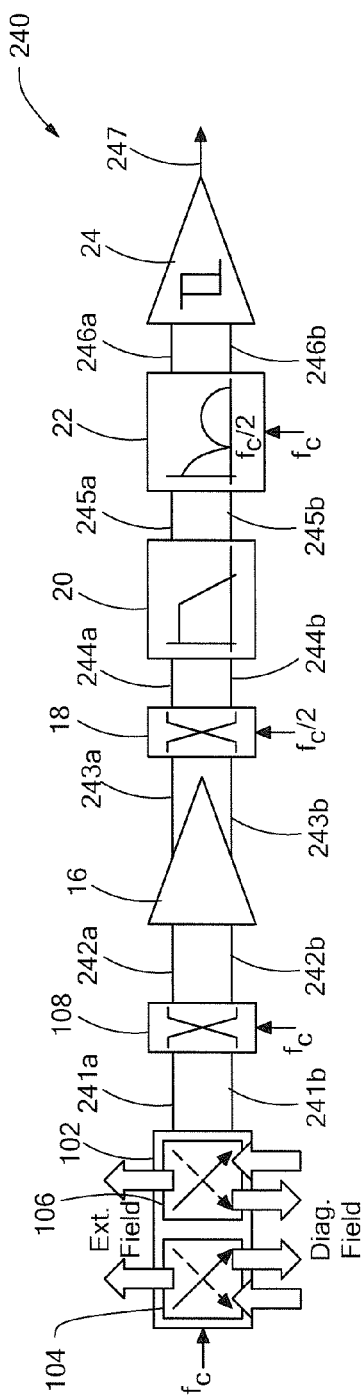
FIG. 8F is a block diagram of the magnetic field sensor of FIGS. 7, 8, 8B, and 8D, and, in particular, the magnetic switch that has the two Hall effect elements but reconfigured so as to be in the diagnostic mode configuration of FIG. 6 or 6A, and including the two coils for generating the diagnostic magnetic fields in opposite directions as indicated in FIG. 6A, all operating in a fourth version diagnostic mode of operation.

Referring now to FIG. 8F, in which like elements of FIGS. 1, 7, 8, 8B, can 8D are shown having like reference designations, a magnetic field sensor 240 is the same as or similar to the magnetic field sensors 100, 150, 200, 220 of FIGS. 7, 8, 8B, and 8D, respectively. The two Hall effect elements 104, 106 are again re-connected, like in FIGS. 8, 8B, and 8D, into the diagnostic mode configuration described above in conjunction with FIGS. 6, 6A by operation of the switching circuit 102.

The magnetic field sensor 240 is provided to describe the fourth version diagnostic mode of operation.

The magnetic field sensor 240 includes the two Hall effect elements 104, 106 coupled within the switching circuit 102. The switching circuit 102 is configured to switch a drive signal to the two Hall effect elements 104, 106 to generate a differential output signal 241a, 241b, which, unlike the signal 102a, 102b of FIG. 7, is responsive to a diagnostic magnetic field generated by the two coils 124, 126 and not responsive to an external magnetic field. Also, unlike the signal 152a, 152b of FIG. 8 and the signal 221a, 221b of FIG. 8D, the signal 221a, 221b has different signal content due to different operation of the switching circuits 122, 102.

The switching circuit 102 is more fully described below in conjunction with FIG. 17. In operation of the magnetic field sensor 240 in the fourth version diagnostic mode of operation, let it suffice here to say that, like the magnetic field sensors 150, 200, 220 of FIGS. 8, 8B, and 8D, respectively, the switching circuit 102 is configured to re-connect the two Hall elements 104, 106 from the normal mode configuration of FIG. 5 into the diagnostic mode configuration of FIGS. 6 and 6A, but, unlike the magnetic field sensor 150 of FIG. 8, and unlike the magnetic field sensor 220 of FIG. 8D, the switching circuit 102 is configured to switch a drive signal (not shown) to the Hall effect elements 102, 104 using a clock with a frequency of $f_c$.

Figure 8G:
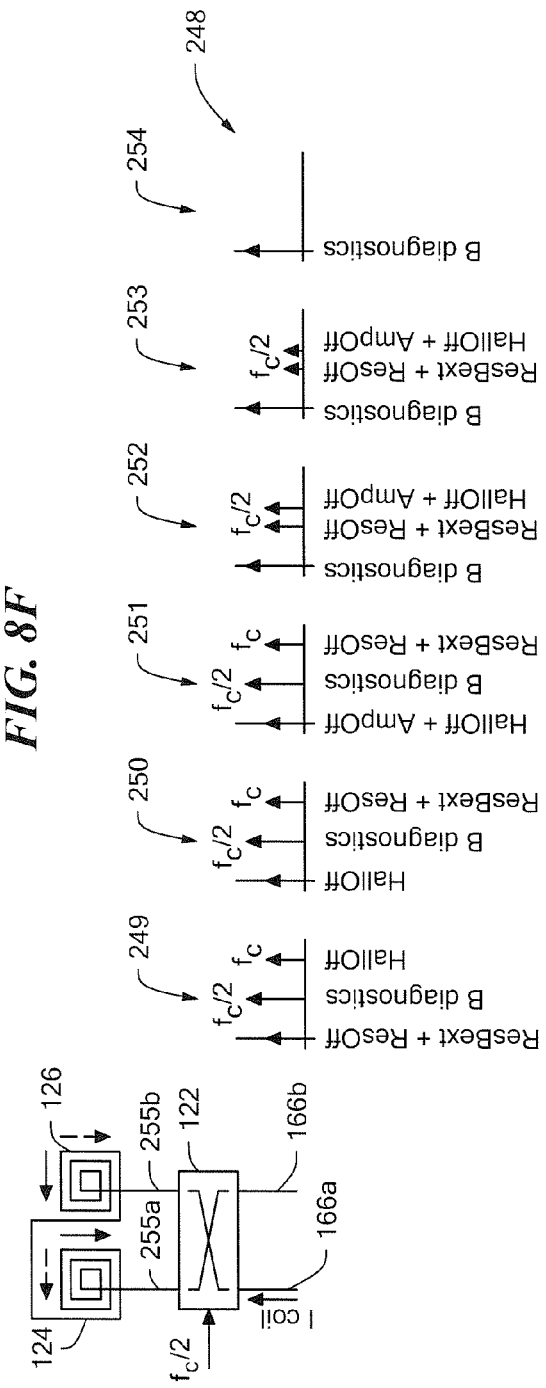
FIG. 8G is a series of graphs showing frequency spectrums of signals at various points in the magnetic field sensor of FIG. 8F.

Signals 241a, 241b, 242a, 242b, 243a, 243b, 244a, 244b, 245a, 245b, 246a, 246b, and 247, described more fully below in conjunction with FIG. 8G, are different from the signals 102a, 102b, 104a, 104b, 106a, 106b, 108a, 108b, 110a, 110b, 112a, 112b, 114a, 114b, 116a, 116b, and 118a of FIG. 7, the signals 152a, 152b, 154a, 154b, 156a, 156b, 158a, 158b, 160a, 160b, 162a, 162b, and 164 o FIG. 8, the signals 201a, 201b, 202a, 202b, 203a, 203b, 204a, 204b, 205a, 205b, 206a, 206b, and 207 of FIG. 8B, and the signals 221a, 221b, 222a, 222b, 223a, 223b, 224a, 224b, 225a, 225b, 226a, 226b, and 227 of FIG. 8D, since the magnetic field sensor 240 operates in the fourth version diagnostic mode of operation.

The two diagnostic mode coils 124, 126 can be coupled to receive the current, Icoil, which, using a clock having a frequency of $f_c/2$, is switched back and forth in direction by the switching circuit 122 coupled between the two diagnostic mode coils 124, 126 and the coil current, Icoil.

The magnetic field sensor 240 is shown having a clocking arrangement indicative of the fourth version diagnostic mode of operation. In particular, in the fourth version diagnostic mode of operation, the switching circuit 122 and the switching circuit 18 are clocked with a clock having a frequency of $f_c/2$, while the switching circuit 102 and the switching circuit 108 are clocked with a clock having a frequency of $f_c$, and the sine filter 22 has a notch at the frequency of $f_c/2$, which can result from a clock signal to the sine filter 22 having a frequency of $f_c$ or another frequency.

The fourth version diagnostic mode of operation is able to perform a self-test of all of the parts of the magnetic field sensor 240, including operation of the switching circuits 102, 108.

Referring now to FIG. 8G, graphs 248 each include a horizontal axis having units of frequency in arbitrary units and a vertical axis having units of power in arbitrary units.

A graph 249 is representative of the signal 241a, 241b, and shows the AC diagnostic magnetic field, Bdiagnostics, resulting from the two diagnostic coils 124, 126, appearing at a frequency according to a frequency of the clock, $f_c/2$, which clocks the switching circuit 122. The graph 249 also shows a spectral component corresponding to a Hall element offset voltage, HallOff, appearing at a frequency according to a frequency of the clock, $f_c$, which clocks the switching circuit 102. A Hall effect element residual offset signal, ResOff, summed with any residual signal due to the external magnetic field, ResBext, is at a different frequency, which can be zero. As described above, the signal, ResBext, can result from a mismatch in the two Hall effect elements 104, 106 when coupled in the diagnostic mode configuration of FIGS. 6 and 6A.

It will be appreciated that the switching circuit 108 operates to modulate the signal 221a, 221b in the fourth version diagnostic mode of operation.

A graph 250 is representative of the signal 242a, 242b after the switching circuit 108. The graph 250 is like the graph 249, except that signal components, HallOff and ResBext+ResOff, are interchanged in frequency.

A graph 251 is representative of the signal 243a, 243b after the amplifier 16. The graph 251 is like the graph 250, except that an amplifier offset voltage, AmpOff, is added at DC.

A graph 252 is representative of the signal 244a, 244b, after the switching circuit 18. As can be seen, the diagnostic magnetic field signal, Bdiagnostics, is shifted to DC, the sum of the signals ResBext, ResOff, is now at the frequency, $f_c/2$, and the sum of the signals HallOff and AmpOff, is also at the frequency, $f_c/2$. A specific phase of the signal controlling the switching circuit 18 is needed for the previous to occur.

A graph 253 is representative of the signal 245a, 245b after the filter 20. A break frequency of the filter 20 is selected to be below the frequency, $f_c$. The residual offset signals, the amplifier offset signal, and the Hall element offset signal are reduced.

A graph 254 is representative of the signal 246a, 246b, after the sine filter 22. The notch of the filter 22 is selected to be at the frequency, $f_c$. Only the diagnostic magnetic field signal remains in the graph 254 and in the signal 226a, 226b.

It should be appreciated that harmonic content is omitted from the graphs of FIGS. 8A, 8C, 8E, and 8G for clarity.

It should also be appreciated that FIGS. 8, 8B, 8D, and 8F corresponding to four exemplary version of the diagnostic mode of operation that show four exemplary relationships between clocks for the various circuit blocks. In other embodiments, other clocks and other relative clock relationships can be used.

Also, two phase chopping of the Hall effect element is shown to be provided by the above switching circuits 102, 108. However, in other embodiments, four phase or other phase chopping can be used.

Circuits 16, 18, 20, 22, and 24 correspond to one form of a processing circuit configured to generate, during a first time period, a sensor output signal, e.g., 118) representative of the measured-magnetic-field-responsive signal portion, and configured to generate, during a second different time period, a sensor output signal (e.g., 164, 207, 227, 247) representative of the diagnostic-magnetic-field-responsive signal portion. The first time period corresponds to a time period during which the normal mode of operation is selected in accordance with FIG. 7. The second different time period corresponds to a time period during which the diagnostic mode of operation is selected in accordance with FIGS. 8-8G.

Figure 9:
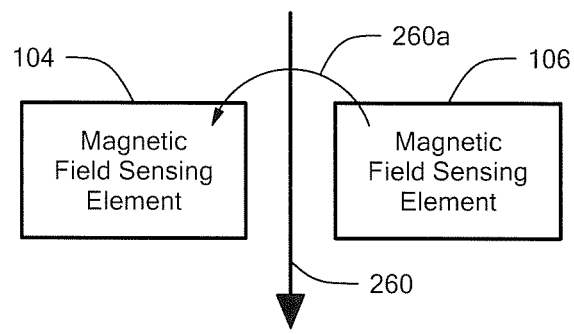
FIG. 9 is a block diagram showing two Hall effect elements, most types of which have a maximum response axis perpendicular to the page, and a conductor carrying a current to generate the diagnostic magnetic fields in opposite directions proximate to the Hall effect elements.
Figure 9A:
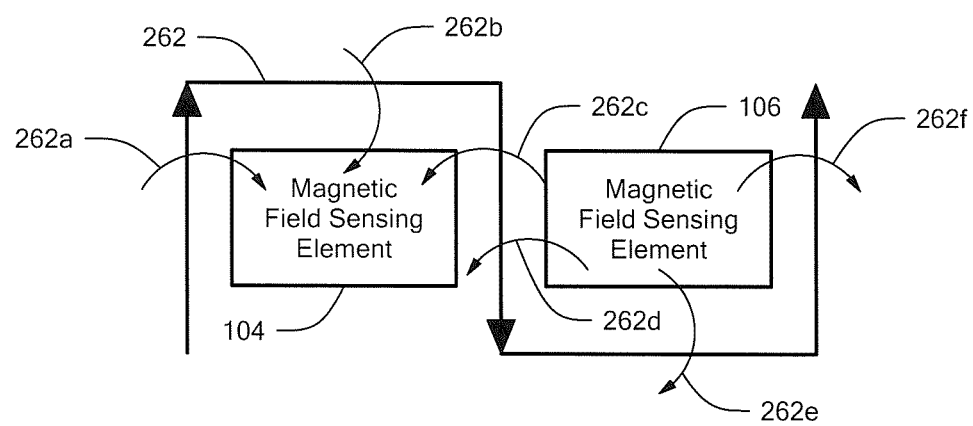
FIG. 9A is a block diagram showing two Hall effect elements and another conductor carrying a current to generate the diagnostic magnetic fields in opposite directions proximate to the Hall effect elements.
Figure 9B:
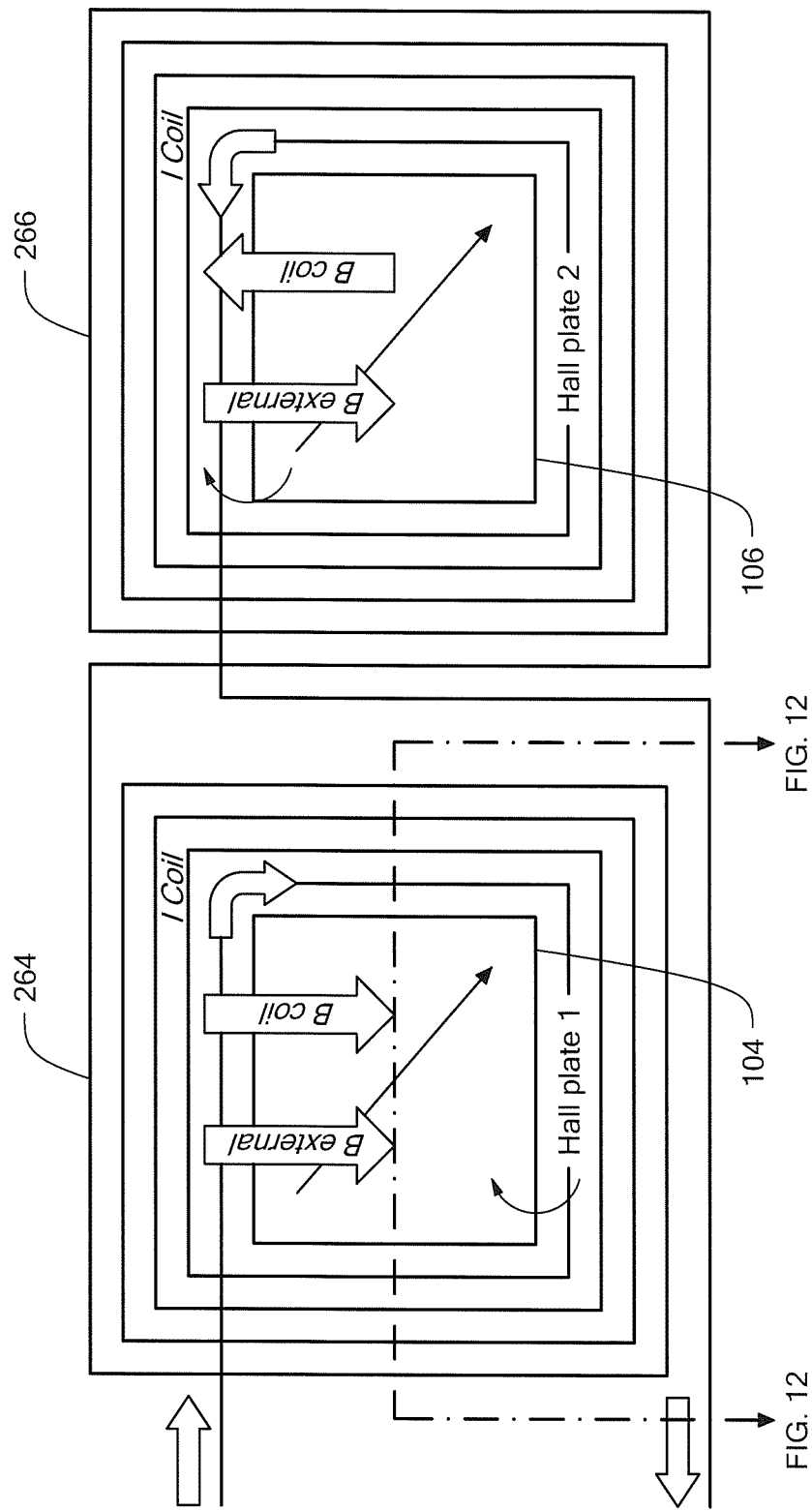
FIG. 9B is a block diagram showing two Hall effect elements and two respective conductive coils carrying a current to generate the diagnostic magnetic fields in opposite directions proximate to the Hall effect elements.

FIGS. 9-9B are representations of the diagnostic coils 124, 126 of FIGS. 7, 8, 8B, and 8D above.

Referring now to FIG. 9, in which like elements of FIGS. 7, 8, 8B, 8D, and 8F are shown having like reference designations, the two diagnostic coils 124, 126 can be comprised of one conductor 260 running between the two Hall effect elements 104, 106. It will be appreciated that a current carried by the conductor 260 in a direction of the arrow tends to generate magnetic fields 260a into and out of the page, and in opposite directions at each of the two Hall effect elements 104, 106, as is desired when the two Hall effect elements 104, 106 are coupled in the diagnostic mode configuration of FIGS. 6 and 6A.

Referring now to FIG. 9A, in which like elements of FIGS. 7, 8, 8B, 8D, and 8F are shown having like reference designations, the two diagnostic coils 124, 126 can be comprised of one conductor 262 running around and between the two Hall effect elements 104, 106. It will be appreciated that a current carried by the conductor 262 in a direction of the arrows tends to generate magnetic fields 262a, 262b, 262c into the page at the Hall effect element 104 and to generate magnetic fields 262d, 262e, 262f out of the page at the Hall effect element 106, i.e., in opposite directions at each of the two Hall effect elements 104, 106, as is desired when the two Hall effect elements 104, 106 are coupled in the diagnostic mode configuration of FIGS. 6 and 6A.

Referring now to FIG. 9B, in which like elements of FIGS. 7, 8, 8B, 8D, and 8F are shown having like reference designations, the two diagnostic coils 124, 126 can be comprised of two coupled coils 264, 266 running around and between the two Hall effect elements 104, 106, and wound in opposite direction relative to the two Hall effect elements 104, 106. It will be appreciated that a current carried by the coil 264 in a direction of the arrow tends to generate a magnetic field into the page at the Hall effect element 104. It will be appreciated that a current carried by the coil 266 in a direction of the arrow tends to generate a magnetic field out of the page at the Hall effect element 106, i.e., in opposite directions at each of the two Hall effect elements 104, 106, as is desired when the two Hall effect elements 104, 106 are coupled in the diagnostic mode configuration of FIGS. 6 and 6A.

Figure 10B:
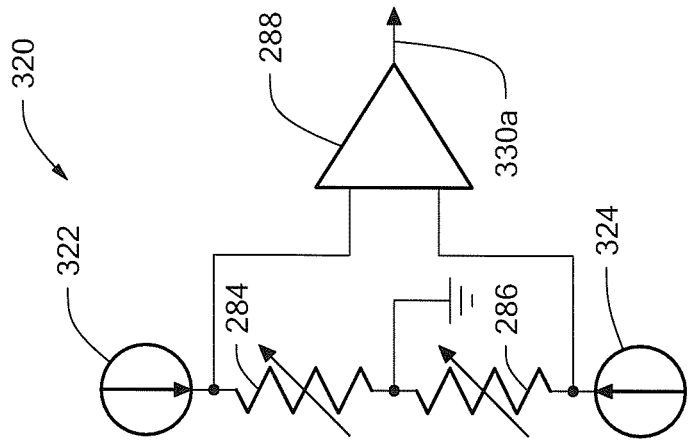
FIG. 10B is a schematic drawing showing two magnetoresistance elements, reconnected so as to be in a diagnostic mode configuration.
Figure 10A:
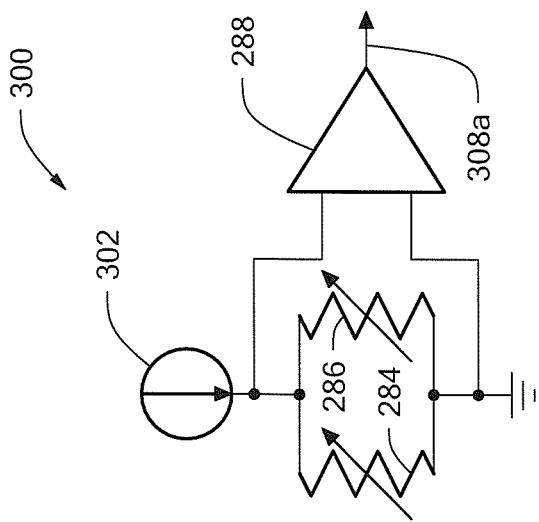
FIG. 10A is a schematic drawing showing two magnetoresistance elements coupled in parallel in another normal mode configuration, which would tend to act in cooperation to an external magnetic field in a particular direction.
Figure 10:
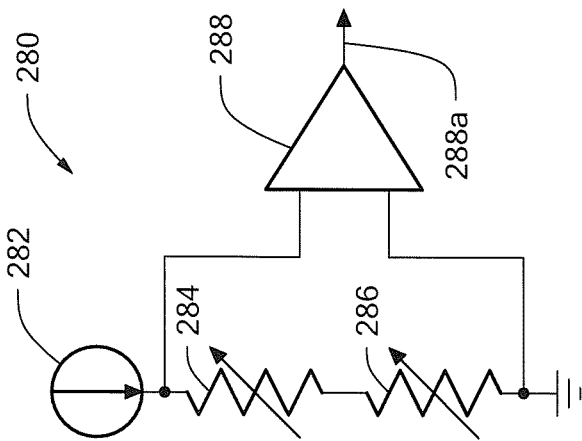
FIG. 10 is a schematic drawing showing two magnetoresistance elements coupled in series in a normal mode configuration, which would tend to act in cooperation in response to an external magnetic field in a particular direction.

Referring now to FIGS. 10-10B, in which like elements are shown having like reference designations, magnetoresistance elements 284, 286 are shown in a series circuit 280, in a parallel circuit 300, and in an opposing circuit 320. It will be understood that the circuits 280 and 300 generate respective output signals 288a, 308a, which, like the normal mode configuration of Hall effect elements of FIG. 5, are responsive to an external magnetic field, but not responsive to a diagnostic magnetic field experienced by the magnetoresistance elements 284, 286 in different directions. It will be understood that the circuit 320 generates an output signal 330a, which, like the diagnostic mode configuration of Hall effect elements of FIGS. 6 and 6A, is responsive to a diagnostic magnetic field experienced by the magnetoresistance elements 284, 286 in different directions, but not responsive to an external magnetic field.

It will be further understood that the Hall effect elements 104, 106 of FIGS. 7, 8, 8B, 8D, and 8F can be replaced by magnetoresistance elements but with modifications to or removal of the switching circuits 102, 108.

Figure 11:
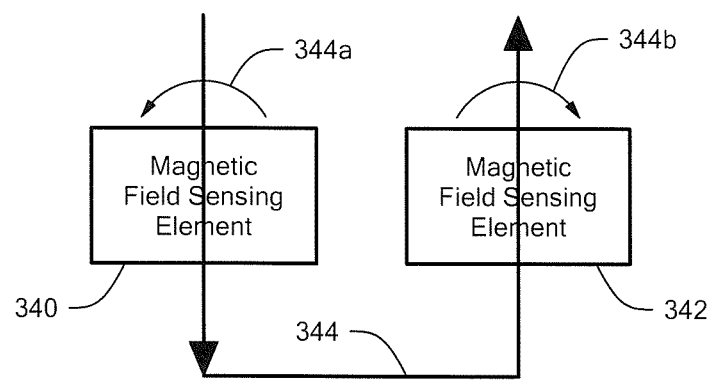
FIG. 11 is a block diagram showing two magnetoresistance elements, most types of which have a maximum response axis parallel to the page, and a conductor carrying a current to generate the diagnostic magnetic fields in opposite directions proximate to the magnetoresistance elements.

Referring now to FIG. 11, because most types of magnetoresistance elements have a maximum response axis parallel to a substrate upon which they are disposed, diagnostic coils comparable to the two diagnostic coils 124, 126 of FIGS. 7, 8, 8B, 8D, and 8F must be differently disposed. In some embodiments, the coils 124, 126 can be comprised of a conductor 344 disposed on top of or underneath two magnetoresistance elements 340, 342. Magnetic fields 344a, 344b tend to be in opposite directions and parallel to surfaces of the magnetoresistance elements 340, 342.

Figure 11A:
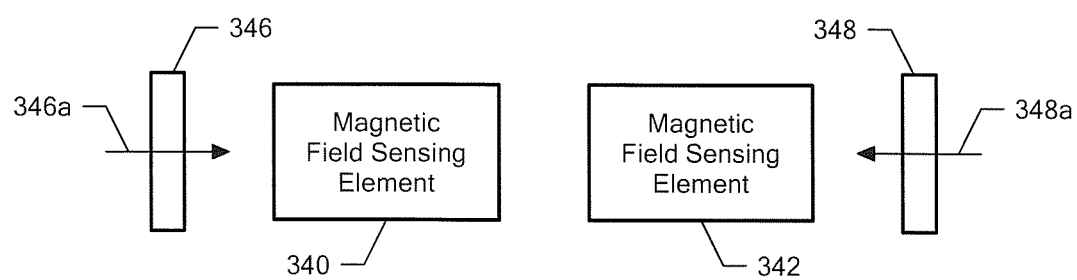
FIG. 11A is a block diagram showing two magnetoresistance elements and two respective conductive coils carrying a current to generate the diagnostic magnetic fields in opposite directions proximate to the magnetoresistance elements.

Referring now to FIG. 11A, in which like elements of FIG. 11 are shown having like reference designations, the two diagnostic coils 124, 126 of FIGS. 7, 8, 8B, 8D, and 8F can be comprised of coils 346, 348, each arranged to generate magnetic fields 346a, 348a in opposite directions parallel to a maximum response axis of the magnetoresistance elements 340, 342.

Figure 12:
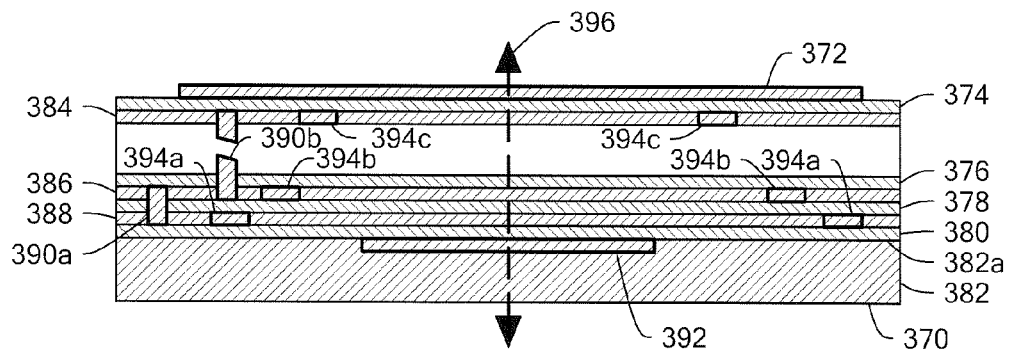
FIG. 12 is block diagram showing a cross section representative of one exemplary arrangement of one of the magnetic field sensing elements and one of the coils of FIG. 9B, wherein the arrangement includes an electromagnetic shield.
Figure 12A:
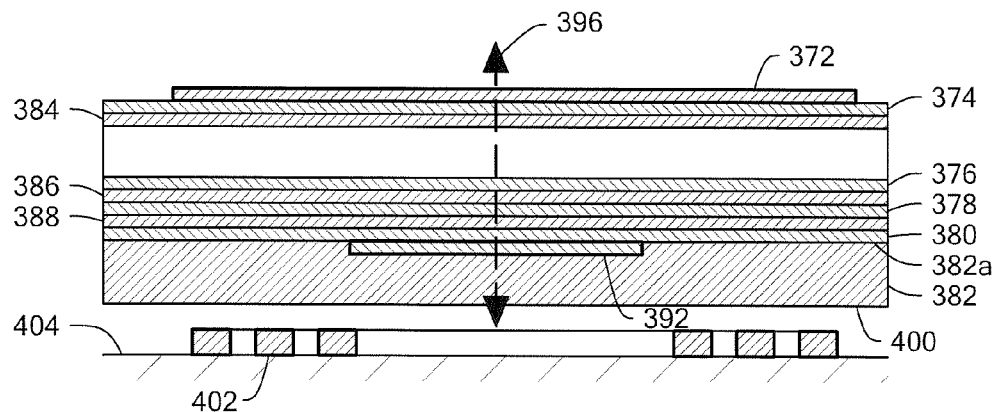
FIG. 12A is block diagram showing a cross section representative of another exemplary arrangement of one of the magnetic field sensing elements and one of the coils of FIG. 9B, wherein the arrangement includes an electromagnetic shield.
Figure 12B:
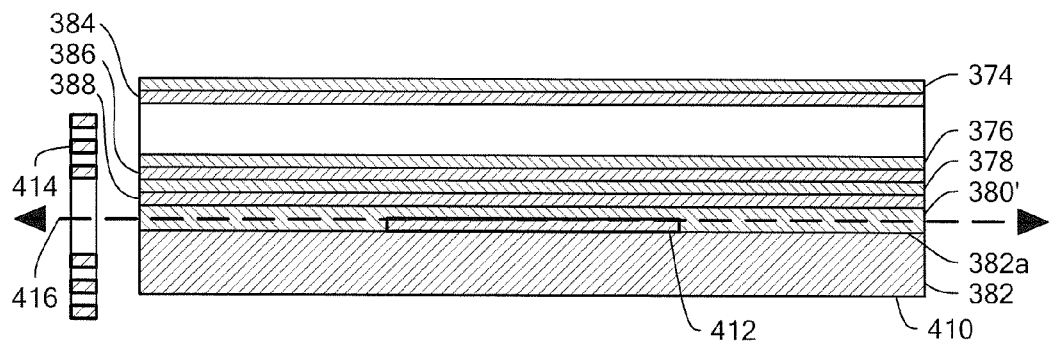
FIG. 12B is block diagram showing a cross section representative of one exemplary arrangement of one of the magnetic field sensing elements and one of the coils of FIG. 11A.
Figure 12C:
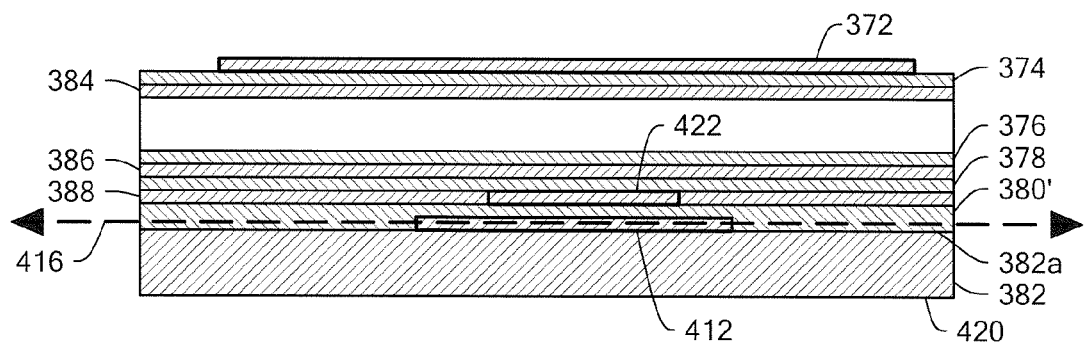
FIG. 12C is block diagram showing a cross section representative of one exemplary arrangement of one of the magnetic field sensing elements and the conductor of FIG. 11, wherein the arrangement includes an electromagnetic shield.
Figure 12D:
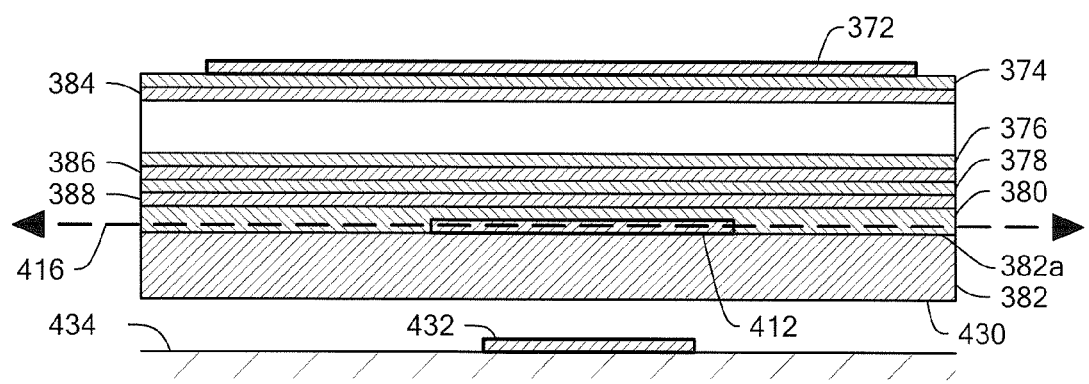
FIG. 12D is block diagram showing a cross section representative of yet another exemplary arrangement of one of the magnetic field sensing elements and the conductor of FIG. 11, wherein the arrangement includes an electromagnetic shield.

FIGS. 12-12D show a variety of integrated circuit configurations. For clarity, only one magnetic field sensing element and one diagnostic coils (or conductor) are shown in the figures. However, one of ordinary skill in the art will understand how to fabricate an integrated circuit having two magnetic field sensing elements and two diagnostic coils. It will be appreciated that some of the magnetic field sensors of FIGS. 12-12D are shown to have electromagnetic shields. However, in other embodiments, the electromagnetic shields are omitted. Similarly, magnetic field sensors of FIGS. 12-12D shown without electromagnetic shields, can, in some other embodiments, have electromagnetic shields.

Referring now to FIG. 12, a cross section of a portion of a magnetic field sensor 370 is representative of one of the two Hall effect elements 104, 106 and one of the diagnostic coils 124, 126 of FIGS. 7, 8, 8B, 8D, and 8F. The magnetic field sensor 370 includes a magnetic field sensing element 392 supported by a substrate 382 having a surface 382a. The magnetic field sensing element 392 may be impregnated into or diffused into and below the surface 382a of the substrate 382, such as is known for manufacturing of Hall effect elements. The magnetic field sensing element 392 can have a maximum response axis 396 generally perpendicular to the surface 382a of the substrate 382.

The magnetic field sensor 370 can include metal layers 384, 386, 388 separated by insulating layers 376, 378, 380. Other metal and insulating layers (not shown) can be disposed between the insulating layer 376 and the metal layer 384. An electromagnetic shield 372 can be disposed over another insulating layer 374.

Sections 394a-394c are representative of a diagnostic coil, such as one of the diagnostic coils 124, 126 of FIGS. 7, 8, 8B, 8D, and 8F. The sections 394a-394c can form one continuous self-test conductor, here disposed on different ones of the metal layers 384, 386, 388 and coupled by way of vias 390a, 390b. A self-test current carried by the self-test conductor 394a-394c tends to form a self-test magnetic field along the maximum response axis 396.

Referring now to FIG. 12A, in which like elements of FIG. 12 are shown having like reference designations, a magnetic field sensor 400 can include all of the layers of the magnetic field sensor 370 of FIG. 12 and also the magnetic field sensing element 392 of FIG. 12, but the self-test conductor 394a-394c of FIG. 12 can be replaced by a continuous external coil self-test conductor 402, which, in some embodiments, can be disposed upon a circuit board 404. The external self-test conductor 402 is representative of one of the diagnostic coils 124, 126 of FIGS. 7, 8, 8B, 8D, and 8F. The self-test conductor 402, shown on one metal layer of the circuit board 404, can instead be formed from a plurality of metal layers upon the circuit board 404. A self-test current carried by the self-test conductor 402 tends to form a self-test magnetic field along the maximum response axis 396.

Referring now to FIG. 12B, in which like elements of FIGS. 12 and 12A are shown having like reference designations, a magnetic field sensor 410 can include all of the layers of the magnetic field sensors 370 of FIGS. 12 and 400 of FIG. 12A, but the external self-test conductor 402 of FIG. 12A can be replaced by a continuous external coil self-test conductor 414. Furthermore, the magnetic field sensing element 392 of FIGS. 12 and 12A can be replaced by a magnetic field sensing element 412 having a maximum response axis 416 generally parallel to the surface 382a of the substrate 382 (e.g., a magnetoresistance element). The external self-test conductor 414 is representative of one of the diagnostic coils 124, 126 of FIGS. 7, 8, 8B, 8D, and 8F but for the magnetoresistance element arrangements of FIGS. 10-10B The magnetic field sensing element 412 may be disposed on or near the surface 382a of the substrate 382, such as is known for manufacturing of magnetoresistance elements. The magnetic field sensing element 392 can have a maximum response axis 416 generally parallel to the surface 382a of the substrate 382. A self-test current carried by the self-test conductor 414 tends to form a self-test magnetic field along the maximum response axis 416.

Referring now to FIG. 12C, in which like elements of FIGS. 12-12B are shown having like reference designations, a magnetic field sensor 420 can include all of the layers of the magnetic field sensors 370, 400 and 410 of FIGS. 12, 12A, and 12B, respectively, and also the magnetic field sensing element 412 of FIG. 12B, but the external self-test conductor 414 of FIG. 12B can be replaced by an internal single conductor self-test conductor 422 as is apparent from FIG. 11. The self-test conductor 422 is representative of one of the diagnostic coils of FIGS. 7, 8, 8B, 8D, and 8F. While one self test conductor 422 is shown, in other embodiments, a plurality of self test conductors can be used, which are arranged to provide a resulting magnetic field at the magnetic field sensing element 412 from the plurality of self test conductors generally aligned with the maximum response axis 416.

A self-test current carried by the self-test conductor 422 tends to form a self-test magnetic field along the maximum response axis 416.

Referring now to FIG. 12D, in which like elements of FIGS. 12-12C are shown having like reference designations, a magnetic field sensor 430 can include all of the layers of the magnetic field sensors 370, 400, 410, and 420 of FIGS. 12, 12A, 12B, and 12C, respectively, but the internal self-test conductor 422 of FIG. 12C can be replaced by an external single conductor self-test conductor 432, which, in some embodiments, can be disposed upon a circuit board 434. The self-test conductor 432 is representative of one of the diagnostic coils of FIGS. 7, 8, 8B, 8D, and 8F. While one self test conductor 432 is shown, in other embodiments, a plurality of self test conductors can be used, which are arranged to provide a resulting magnetic field at the magnetic field sensing element 412 from the plurality of self test conductors generally aligned with the maximum response axis 416.

A self-test current carried by the self-test conductor 432 tends to form a self-test magnetic field along the maximum response axis 416.

While FIGS. 12-12D show various alternative embodiments associated with the magnetic field sensors of FIGS. 7 8, 8B, 8D, and 8F, it will be recognized that there are many other possible configurations, including, but not limited to, combinations of the configurations shown.

While FIGS. 12-12D are representative of portions of magnetic field sensors 370, 400, 410, 420, 430, it should be understood that the magnetic field sensing elements and the self-test current conductors can be disposed on the same substrate as other portions of the magnetic field sensors of FIGS. 7, 8, 8B, 8D, and 8F, or, in other embodiments on a second different substrate from the other portions of the magnetic field sensors of FIGS. 7, 8, 8B, 8D, and 8F.

Figure 12E:
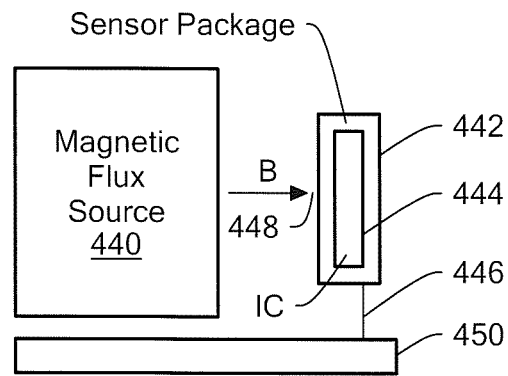
FIGS. 12E-12G are block diagrams showing three arrangements for magnetic field sensors.

Referring now to FIG. 12E, a magnetic field sensor 444, here encased in a package 442, can be the same as or similar to the magnetic field sensors of FIGS. 7, 8, 8B, 8D, and 8F. The magnetic field sensor 444 can be coupled to a lead frame having leads 446. The leads 446 can be electrically coupled to a circuit board 450. The magnetic field sensor 444 can be responsive to a magnetic field 448 perpendicular to a major surface of the magnetic field sensor 444, such as may be generated by proximity of a magnetic field source 440, for example, a ferromagnetic object.

Figure 12F:
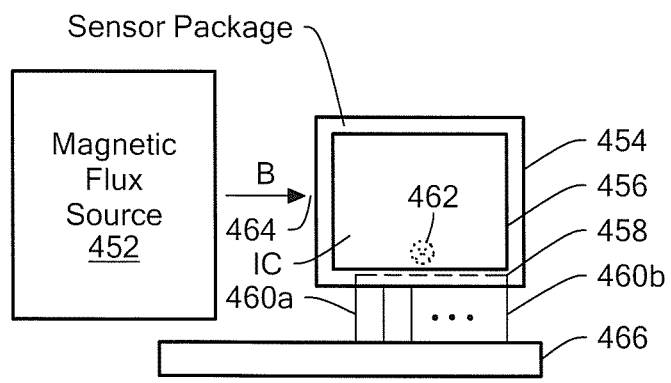

Referring now to FIG. 12F, a magnetic field sensor 456, here encased in a package 454, can be the same as or similar to the magnetic field sensors of FIGS. 7, 8, 8B, 8D, and 8F. The magnetic field sensor 456 can be coupled to a lead frame having leads, of which leads 460a, 460b are representative. The leads, e.g., 460a, 460b, can be electrically coupled to a circuit board 466. The magnetic field sensor 456 can be responsive to a magnetic field 464 parallel to a major surface of the magnetic field sensor 456, such as may be generated by proximity of a magnetic field (or flux) source 452, for example, a ferromagnetic object.

Also shown, in some alternate embodiments, the leads can be coupled with a measured conductor 458, which can be formed as a part of the lead frame of which the leads 460a, 460b are another part. A measured current carried by the measured conductor 458 tends to form a magnetic field 462 going into or out of the page, depending upon a direction of the current carried by the measured conductor 458. For these arrangements, the magnetic field sensor 456 can be a current sensor and the magnetic field sensor 456 can instead be responsive to the magnetic field 462 perpendicular to the major surface of the magnetic field sensor 456 (i.e., to the current) rather than to the magnetic field 464.

While a particular integrated circuit package (e.g., a SIP) is shown in FIG. 12F, it should be understood that the same behavior can be accomplished with other integrated circuit packages, for example a DIP, a flip-chip, or an MLP package. With some of these packages, or with the SIP package if bent over, the magnetic field sensor 456 can be disposed having a major surface parallel to the circuit board 466.

Figure 12G:
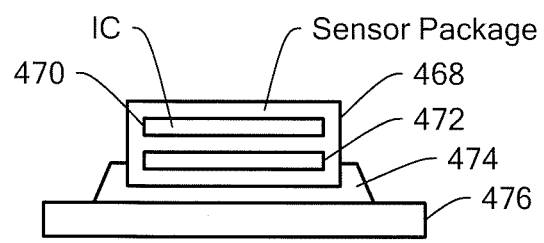

Referring now to FIG. 12G, a magnetic field sensor 470, here encased in a package 468, can be the same as or similar to the magnetic field sensors of FIGS. 7, 8, 8B, 8D, and 8F. The magnetic field sensor 470 can be coupled to a lead frame having leads, of which a lead 474 is representative. The leads, e.g., 474, can be electrically coupled to a circuit board 476. The magnetic field sensor 470 can be responsive to a magnetic field generated by proximity of a magnetic field source 472 within the package 468. For example, the magnetic field source 472 can be a measured current conductor similar to the measured current conductor 458 of FIG. 12F.

Figure 13:
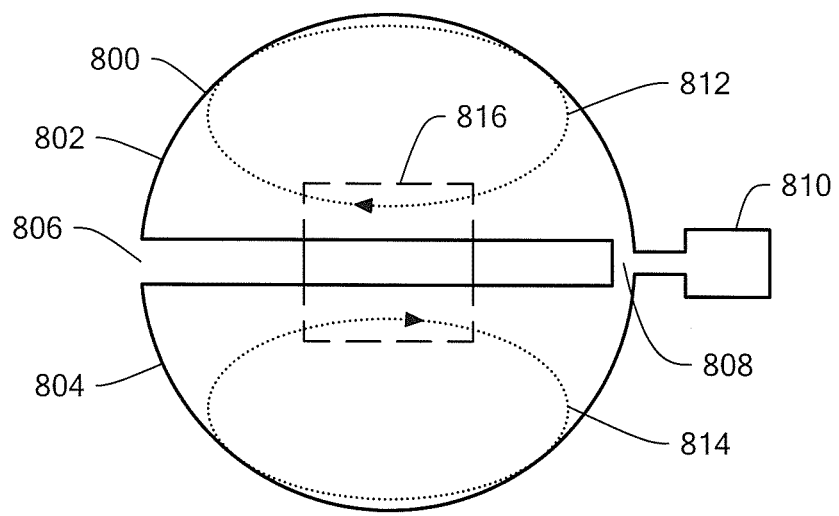
FIG. 13 is a top view of an exemplary electromagnetic shield that can form part of the magnetic field sensor of FIGS. 7, 8, 8B, 8D, and 8F, and which can be used as the electromagnetic shield of FIGS. 12, 12A, 12C, and 12D.

Referring now to FIG. 13, an exemplary electromagnetic shield 800 can be the same as or similar to the electromagnetic shield 372 of FIG. 12. The electromagnetic shield 800 is placed generally over a magnetic field sensing element 816, which can be the same as or similar to the magnetic field sensing element 392 of FIG. 12. The electromagnetic shield 800 includes a first portion 802 and a second portion 804 separated by a slit 806. The first portion 802 and the second portion 804 are coupled with a conductive region 808. A bonding pad 810 allows the electromagnetic shield 800 to be coupled to a DC voltage, for example, to a ground voltage.

The electromagnetic shield 800 can be formed from a metal layer during manufacture of a magnetic field sensor, for example, the magnetic field sensors of FIGS. 7, 8, 8B, 8D, and 8F. The metal layer can be comprised of a variety of materials, for example, aluminum, copper, gold, titanium, tungsten, chromium, or nickel. A nickel layer would need to be thin so as not to concentrate the magnetic flux too much away from a Hall plate, especially if the shield has slits or slots.

It should be understood that an electromagnetic shield is not the same as a magnetic shield. An electromagnetic shield is intended to block electromagnetic fields. A magnetic shield is intended to block magnetic fields.

In the presence of an AC magnetic field (e.g., a magnetic field surrounding a current carrying conductor), it will be understood that AC eddy currents 812, 814 can be induced in the electromagnetic shield 800. The eddy currents 812, 814 form into closed loops as shown. The closed loop eddy currents 812, 814 tend to result in a smaller magnetic field in proximity to the electromagnetic shield 800 than the magnetic field that induced the eddy currents 812, 814. Therefore, if the electromagnetic shield 800 were placed near a magnetic field sensing element, for example, the magnetic field sensing element 392 of FIG. 12, the magnetic field sensing element 392 experiences a smaller magnetic field than it would otherwise experience, resulting in a less sensitive magnetic field sensor, which is generally undesirable. Furthermore, if the magnetic field associated with the eddy current is not uniform or symmetrical about the magnetic field sensing element 392, the magnetic field sensing element 392 might also generate an undesirable offset voltage.

The slit 806 tends to reduce a size (i.e., a diameter or path length) of the closed loops in which the eddy currents 812, 814 travel. It will be understood that the reduced size of the closed loops in which the eddy currents 812, 814 travel results in smaller eddy currents 812, 814 and a smaller local effect on the AC magnetic field that induced the eddy current. Therefore, the sensitivity of a magnetic field sensor on which the magnetic field sensing element 816 and the electromagnetic shield 800 are used is less affected by the smaller eddy currents.

Furthermore, by placing the shield 800 in relation to the magnetic field sensing element 816 as shown, so that the slit 806 passes over the magnetic field sensing element 816, it will be understood that the magnetic field associated with any one of the eddy currents 812, 814 tends to form magnetic fields passing through the magnetic field sensing element 816 in two directions, canceling over at least a portion of the area of the magnetic field sensing element 816.

Figure 14:
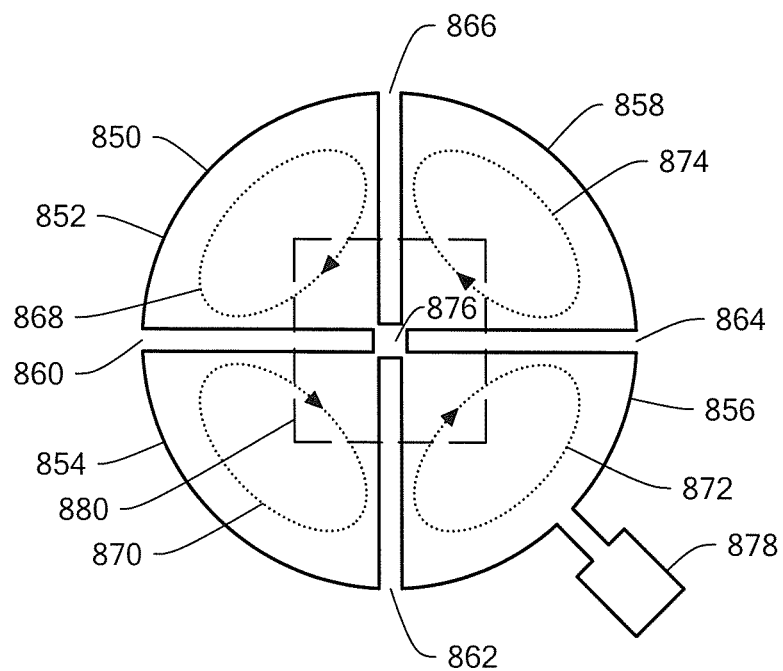
FIG. 14 is a top view of another exemplary electromagnetic shield that can form part of the magnetic field sensor of FIGS. 7, 8, 8B, 8D, and 8F, and which can be used as the electromagnetic shield of FIGS. 12, 12A, 12C, and 12D.

Referring now to FIG. 14, another exemplary electromagnetic shield 850 can be the same as or similar to the electromagnetic shield 372 of FIG. 12. The electromagnetic shield 850 includes four portions 852-858 separated by four slits 860-866. The four portions 852-858 are coupled with a conductive region 876. A bonding pad 878, allows the electromagnetic shield 850 to be coupled to a DC voltage, for example, a ground voltage.

In the presence of a magnetic field, it will be understood that eddy currents 868-874 can be induced in the electromagnetic shield 850. Due to the four slits 860-866, it will be understood that a size (i.e., a diameter or a path length) of the closed loops eddy currents 866-874 tends to be smaller than the size of the closed loop eddy currents 812, 814 of FIG. 11. It will be understood that the reduced size of the closed loops in which the eddy currents 868-874 travel results in smaller eddy currents 868-874 and a smaller local affect on the AC magnetic field that induced the eddy current than that which results from the shield 800 of FIG. 13. Therefore, the sensitivity of a magnetic field sensor on which the magnetic field sensing element 880 and the electromagnetic shield 850 are used is less affected by the smaller eddy currents 868-874 than the sensitivity of a current sensor using the shield 800 of FIG. 13.

Furthermore, by placing the shield 850 in relation to the magnetic field sensing element 880 as shown, so that the slits 860-866 pass over the magnetic field sensing element 880, it will be understood that the magnetic field associated with any one of the eddy currents 868-874, tends to form magnetic fields passing through the magnetic field sensing element 880 in two directions, canceling over at least a portion of the area of the magnetic field sensing element 880.

Figure 15:
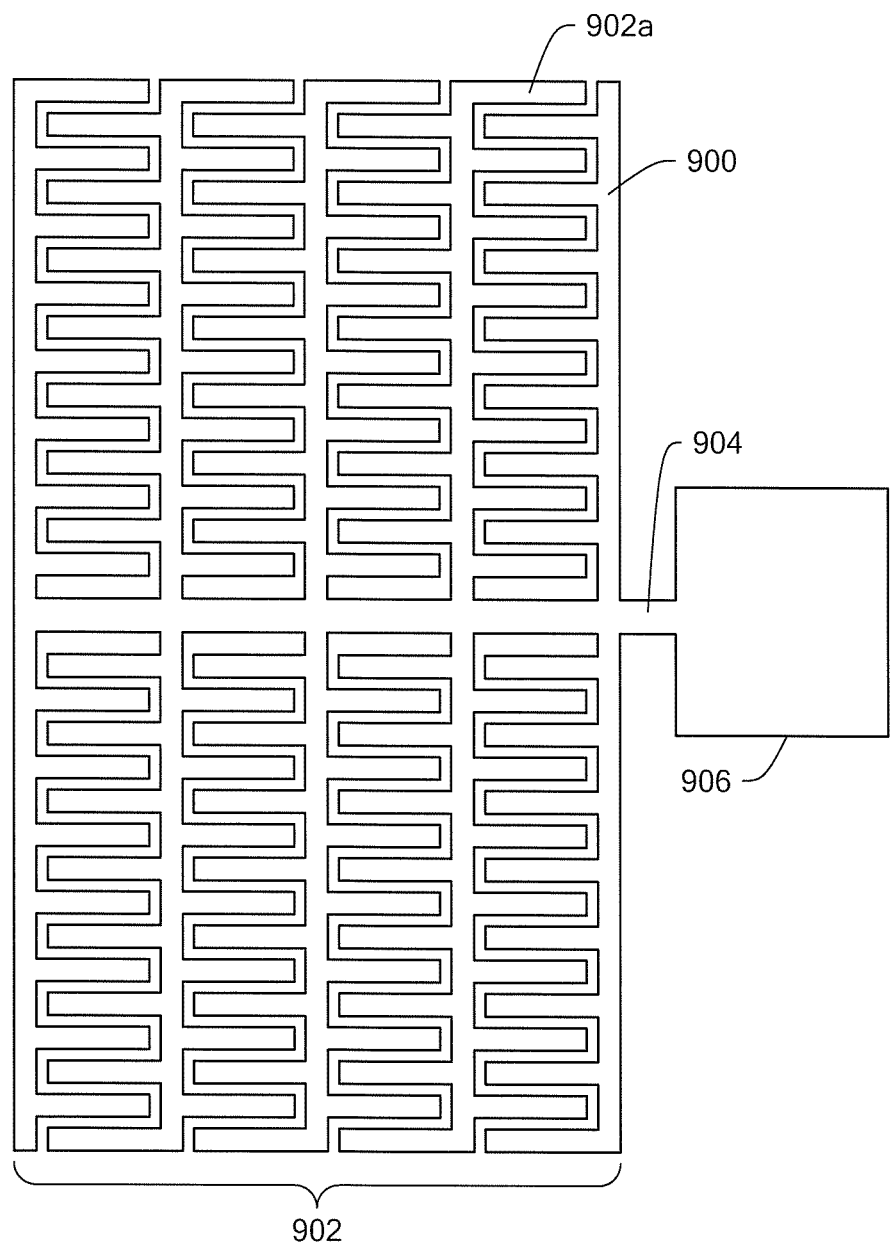
FIG. 15 is a top view of yet another exemplary electromagnetic shield that can form part of the magnetic field sensor of FIGS. 7, 8, 8B, 8D, and 8F, and which can be used as the electromagnetic shield of FIGS. 12, 12A, 12C, and 12D.

Referring now to FIG. 15, another exemplary electromagnetic shield 900 can be the same as or similar to the electromagnetic shield 372 of FIG. 12. The electromagnetic shield 900 includes a shielding portion 902 having interdigitated members, of which member 902a is but one example. The interdigitated members are coupled though a conductor portion 904 to a bonding pad 906, which allows the electromagnetic shield 900 to be coupled to a DC voltage, for example, a ground voltage.

It will be recognized that the electromagnetic shield 900 is able to support eddy currents having a much smaller size (i.e., diameter of path length) than the electromagnetic shield 850 of FIG. 14 or the electromagnetic shield 800 of FIG. 13. Therefore, the electromagnetic shield 900 tends to have an even smaller negative affect on sensitivity of a magnetic field sensor than that described above.

Figure 16:
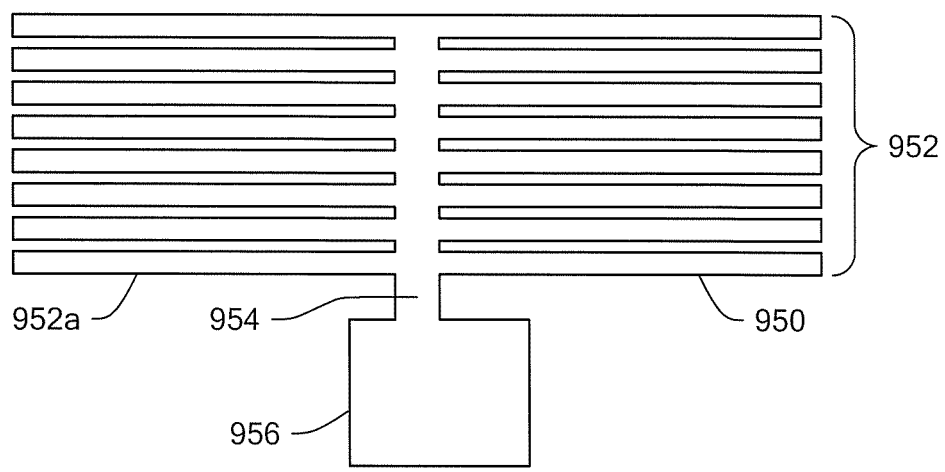
FIG. 16 is a top view of yet another exemplary electromagnetic shield that can form part of the magnetic field sensor of FIGS. 7, 8, 8B, 8D, and 8F, and which can be used as the electromagnetic shield of FIGS. 12, 12A, 12C, and 12D.

Referring now to FIG. 16, an electromagnetic shield 950 can be the same as or similar to the electromagnetic shield 372 of FIG. 12. The electromagnetic shield 950 includes a shielding portion 952 having a plurality of members, of which member 952a is but one example. The members are coupled though a conductor portion 954 to a bonding pad 956, which allows the electromagnetic shield 950 to be coupled to a DC voltage, for example, a ground voltage. Advantages of the electromagnetic shield 950 will be apparent from discussion above.

While shields having features to reduce eddy currents are described above, the shield 372 of FIGS. 12, 12A, 12C, and 12D can also have no features to reduce eddy currents.

Referring now to FIG. 17, in which like elements of FIGS. 7, 8, 8B, 8D, and 8F are shown having like reference designations, switches S1-S8 can correspond to the switching circuit 102 of FIGS. 7, 8, 8B, 8D, and 8F. In operation, the switches S1-S4 can switch a direction of applied current to the two Hall effect elements 104, 106, to provide a first signal modulation comparable to that provided by the switches 60a-60d of FIG. 2 or 80a-80d of FIG. 3. In operation, the switches S5-S8 perform two functions: to connect the Hall effect elements 104, 106 into the normal mode or diagnostic mode of operation by selecting certain ones of the input nodes to each switch S5-S8, and also, in some embodiments, to modulate (or demodulate) the signal from the two Hall effect elements 104, 106 by switching between the certain ones of the input nodes to each switch S5-S8. Reconnection and switching of the switches S5-S8 is more fully described below in conjunction with FIG. 18, and differs for each one of the four above-described diagnostic modes of operation.

The connection into the normal mode or diagnostic mode of operation of the switches S5-S8 (as well as the operation of the switches S1-S4) is represented above within the switching circuit 102 of FIGS. 7, 8, 8B, 8D, and 8F. However, for clarity, the modulation function of the switches S5-S8 is represented separately by the switching circuit 108 of FIGS. 7, 8, 8B, 8D, and 8F. Though shown as two switching circuits 102, 108, it will be understood that the two switching circuits 102, 108 can be one switching circuit as shown in FIG. 17. However, in other arrangements, the two functions described above in conjunction with switches S5-S8 can be performed by two separate sets of switches.

Circuit 1000 provides for the above-described normal mode configuration, the above-described four diagnostic mode configurations, and also allows for the clocking or non-clocking functions of the switching circuits 102, 108 described above, i.e., for normal mode of operation and for the first, second, third, and fourth version diagnostic modes of operation.

A differential output signal, V+, V−, is representative of an output signal from the switching circuit 108 of FIG. 7, 8, 8B, 8D, or 8F, which output signal is different for each of the magnetic field sensors of FIG. 7, 8, 8B, 8D, or 8F. The different output signals are determined according to switch positions and clocking of switches discussed below in conjunction with FIG. 18.

Referring now to FIG. 18, in which switches, S1-S8 of FIG. 17 are designated, a chart is representative of switch positions for the normal mode of operation and for the first, second, third, and fourth version diagnostic modes of operation. A column labeled "state" is representative of how the switches are changed during two phases of a clock signal, for the clock signals having relative frequencies described above in conjunction with FIGS. 7-8G.

Figure 19:
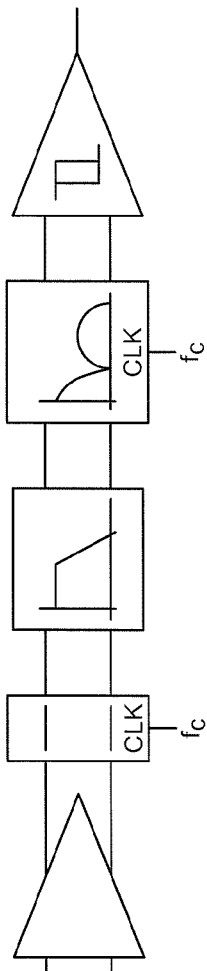
FIGS. 19 and 19A are schematic diagrams showing the circuit of FIG. 7 showing switch positions of FIG. 17 used in a normal mode of operation.
Figure 19A:
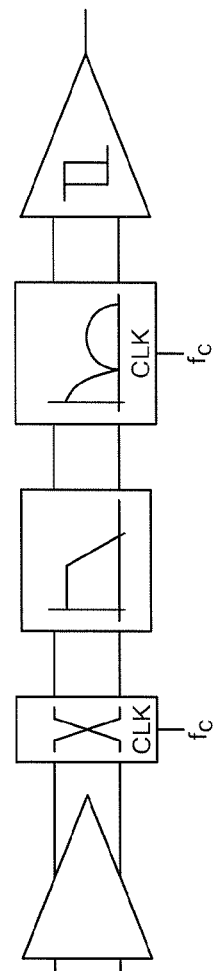

Referring now to FIGS. 19 and 19A, circuits show switch positions (FIG. 17) and relative clock frequencies for the two phases (i.e., for the two drive directions provide by the switching circuit 102 of FIG. 7, when operating in the normal mode of operation.

Figure 20:
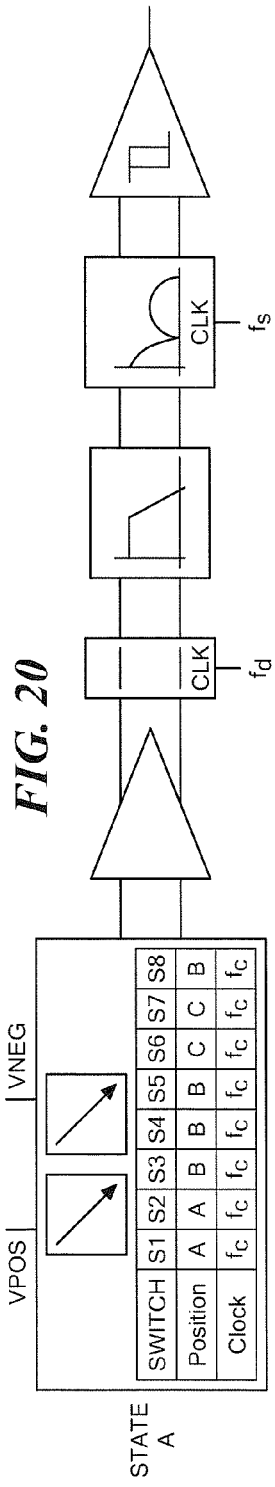
FIGS. 20 and 20A are schematic diagrams representative of the circuit of FIG. 7 showing switch positions of FIG. 17 generally used in a diagnostic mode of operation.
Figure 20A:
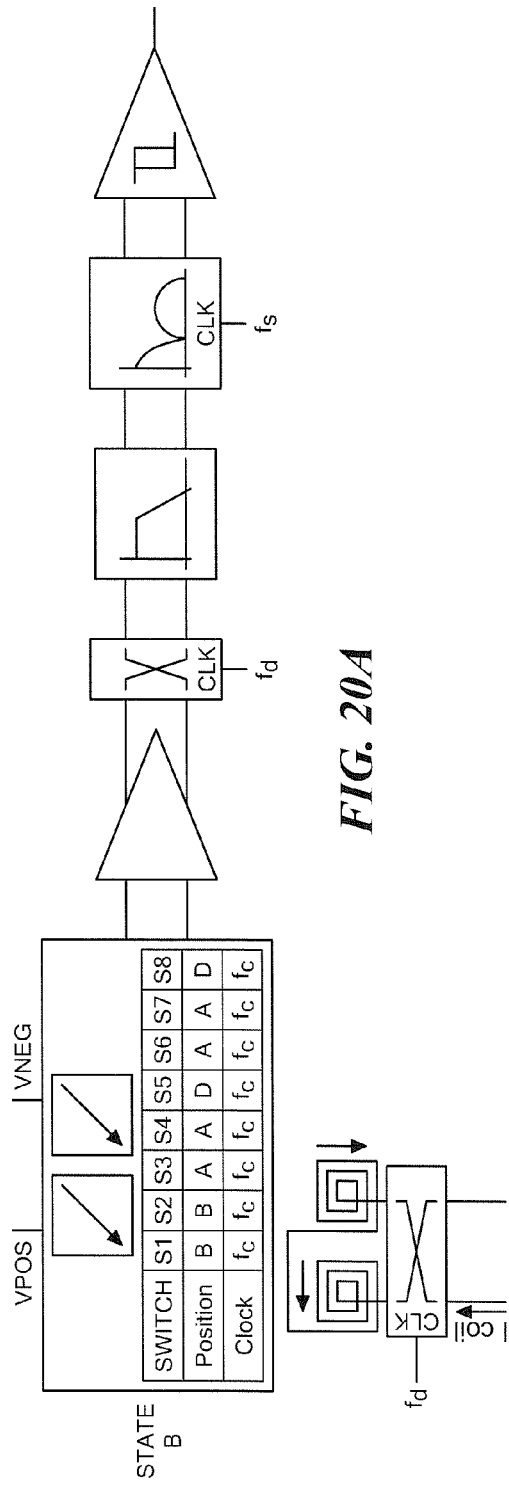

Referring now to FIGS. 20 and 20A, circuits show switch positions (FIG. 17) and relative clock frequencies for the two phases (i.e., for the two drive directions provide by the switching circuits 102 of FIG. 7) of the circuit 100 of FIG. 7, operating generally in a diagnostic mode of operation.

Referring now to FIGS. 21 and 21A, circuits show switch positions (FIG. 17) and relative clock frequencies for the two phases (i.e., for the two drive directions provide by the switching circuits 102 of FIG. 8) of the circuit 150 of FIG. 8, operating in the first version diagnostic mode of operation.

Referring now to FIGS. 22 and 22A, circuits show switch positions (FIG. 17) and relative clock frequencies for the two phases (i.e., for the two drive directions provide by the switching circuits 102 of FIG. 8B) of the circuit 200 of FIG. 8B, operating in the second version diagnostic mode of operation.

Figure 23:
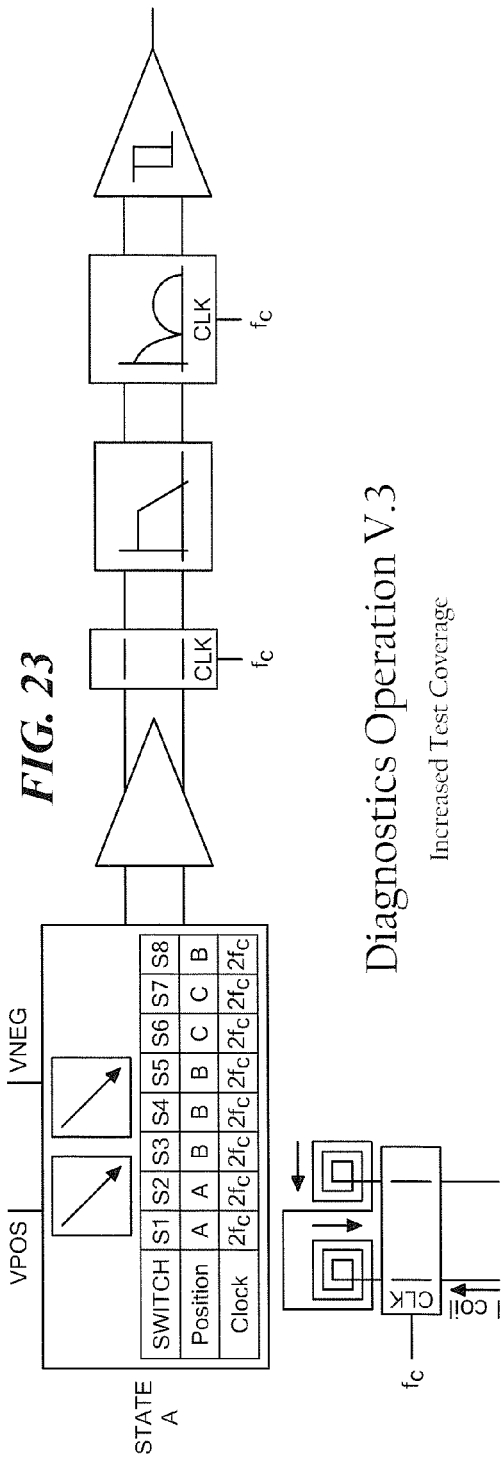
FIGS. 23 and 23A are schematic diagrams showing the circuit of FIG. 8D showing switch positions of FIG. 17 used in the third version diagnostic mode of operation.
Figure 23A:
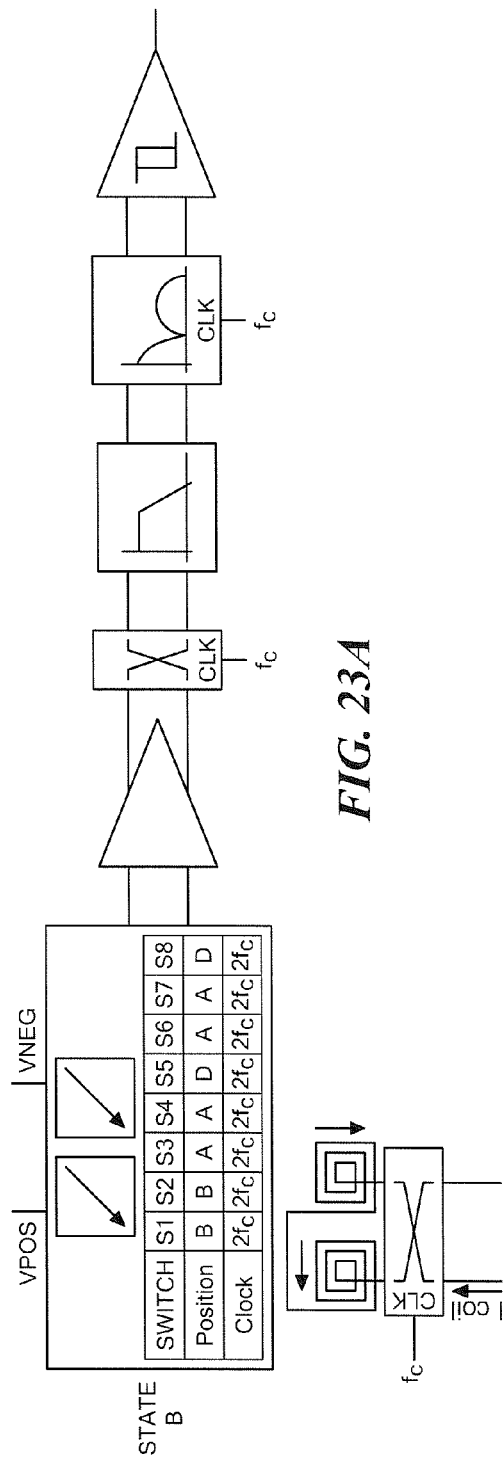

Referring now to FIGS. 23 and 23A, circuits show switch positions (FIG. 17) and relative clock frequencies for the two phases (i.e., for the two drive directions provide by the switching circuits 102 of FIG. 8D) of the circuit 220 of FIG. 8D, operating in the third version diagnostic mode of operation.

Referring now to FIGS. 24 and 24A, circuits show switch positions (FIG. 17) and relative clock frequencies for the two phases (i.e., for the two drive directions provide by the switching circuits 102 of FIG. 8F) of the circuit 240 of FIG. 8F, operating in the fourth version diagnostic mode of operation.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor, comprising:
   at least two magnetic field sensing elements; and
   a switching circuit coupled to the at least two magnetic field sensing elements, wherein the switching circuit is configured to couple the at least two magnetic field sensing elements into a normal mode configuration when the magnetic field sensor is in a normal mode of operation, and wherein the switching circuit is configured to couple the at least two magnetic field sensing elements into a diagnostic mode configuration when the magnetic field sensor is in a diagnostic mode of operation, wherein the switching circuit is configured to couple the at least two magnetic field sensing elements in parallel so as to respond in cooperation in the presence of an external magnetic field when coupled in the normal mode configuration, and to couple the at least two magnetic field sensing elements such that the responses to the external magnetic field oppose one another when coupled in the diagnostic mode configuration, and wherein the at least two magnetic field sensing elements are configured to generate a magnetic field signal comprising:
   a measured-magnetic-field-responsive signal portion responsive to the external magnetic field and substantially unresponsive to a diagnostic magnetic field when coupled in the normal mode configuration; and
   a diagnostic-magnetic-field-responsive signal portion responsive to the diagnostic magnetic field and substantially unresponsive to the external magnetic field when coupled in the diagnostic mode configuration.

2. The magnetic field sensor of claim 1, wherein the switching circuit is configured to switch in response to a clock signal, resulting in a frequency shift of at least one of the measured-magnetic-field-responsive signal portion or the diagnostic-magnetic-field-responsive signal portion.

3. The magnetic field sensor of claim 1, further comprising:
   a diagnostic circuit comprising at least two diagnostic conductor portions proximate to the at least two magnetic field sensing elements, respectively, wherein the at least two diagnostic conductor portions are configured to carry a current to generate the diagnostic magnetic field, wherein the diagnostic magnetic field comprises at least two diagnostic magnetic field portions having respective magnetic field directions directed in opposite directions.

4. The magnetic field sensor of claim 3, further comprising a processing circuit coupled to receive a signal representative of the measured-magnetic-field-responsive signal portion when the at least two magnetic field sensing elements are coupled in the normal mode configuration and coupled to receive a signal representative of the diagnostic-magnetic-field-responsive signal portion when the at least two magnetic field sensing elements are coupled in the diagnostic mode configuration, wherein the processing circuit is configured to generate, during a first time period, a sensor output signal representative of the measured-magnetic-field-responsive signal portion, and configured to generate, during a second different time period, a sensor output signal representative of the diagnostic-magnetic-field-responsive signal portion.

5. The magnetic field sensor of claim 3, wherein the diagnostic circuit further comprises:
   a current generator circuit having an output node at which self-test current pulses are generated, wherein the at least two diagnostic conductor portions are coupled to receive the self-test current pulses resulting in the diagnostic magnetic field having magnetic field pulses.

6. The magnetic field sensor of claim 3, wherein the at least two magnetic field sensing elements comprise at least two Hall effect elements.

7. The magnetic field sensor of claim 3, wherein the at least two magnetic field sensing elements comprise at least two magnetoresistance elements.

8. The magnetic field sensor of claim 3, wherein the at least two magnetic field sensing elements are supported by a substrate, and wherein the at least two diagnostic conductor portions comprise a conductor supported by the substrate and proximate to the at least two magnetic field sensing elements.

9. The magnetic field sensor of claim 8, wherein the at least two diagnostic conductor portions span more than one metal layer supported by the substrate.

10. The magnetic field sensor of claim 3, wherein the at least two magnetic field sensing elements are supported by a substrate, and wherein the at least two diagnostic conductor portions comprise a conductor separate from but proximate to the substrate.

11. The magnetic field sensor of claim 3, further comprising a circuit board proximate to the at least two magnetic field sensing elements, wherein the at least two diagnostic conductor portions comprises a conductor supported by the circuit board.

12. The magnetic field sensor of claim 11, wherein the at least two diagnostic conductor portions comprise a coil supported by the circuit board and spanning more than one metal layer supported by the circuit board.

13. The magnetic field sensor of claim 3, further comprising an electromagnetic shield proximate to the at least two diagnostic conductor portions.

14. The magnetic field sensor of claim 13, wherein the electromagnetic shield comprises at least one feature configured to reduce an eddy current in the electromagnetic shield when the shield is exposed to an AC magnetic field.

15. The magnetic field sensor of claim 3, wherein the external magnetic field is generated by a current carried by a measured-current conductor.

16. The magnetic field sensor of claim 15, further comprising a lead frame comprising a plurality of leads and a coupling of at least two of the leads proximate to the magnetic field sensor, wherein the measured-current conductor comprises the coupling of the at least two of the leads.

17. A method of generating a self-test of a magnetic field sensor, comprising:
coupling at least two magnetic field sensing elements into a normal mode configuration when the magnetic field sensor is in a normal mode of operation, wherein the coupling the at least two magnetic field sensing elements into the normal mode configuration comprises coupling the at least two magnetic field sensing elements in parallel so as to respond in cooperation in the presence of an external magnetic field, and
coupling the at least two magnetic field sensing elements into a diagnostic mode configuration when the magnetic field sensor is in a diagnostic mode of operation, and wherein the coupling the at least two magnetic field sensing elements into the diagnostic mode configuration comprises coupling the at least two magnetic field sensing elements such that their responses to the external magnetic field oppose one another, wherein the at least two magnetic field sensing elements are configured to generate a magnetic field signal comprising:
 a measured-magnetic-field-responsive signal portion responsive to the external magnetic field and substantially unresponsive to a diagnostic magnetic field when coupled in the normal mode configuration; and
 a diagnostic-magnetic-field-responsive signal portion responsive to the diagnostic magnetic field and substantially unresponsive to the external magnetic field when coupled in the diagnostic mode configuration.

18. The method of claim 17, further comprising:
generating a current in a diagnostic circuit comprising at least two diagnostic conductor portions proximate to the at least two magnetic field sensing elements, respectively, wherein the at least two diagnostic conductor portions are configured to carry the current to generate the diagnostic magnetic field, wherein the diagnostic magnetic field comprises at least two diagnostic magnetic field portions having respective magnetic field directions directed in opposite directions.

19. The method of claim 18, further comprising
generating a sensor output signal representative of the measured-magnetic-field-responsive signal portion; and
generating a sensor output signal representative of the diagnostic-magnetic-field-responsive signal portion.

20. The method of claim 18, wherein the at least two coupled magnetic field sensing elements are supported by a substrate, and wherein the at least two diagnostic conductor portions comprise a conductor supported by the substrate and proximate to the at least two magnetic field sensing elements.

21. The method of claim 20, wherein the at least two diagnostic conductor portions comprise a coil supported by the substrate and spanning more than one metal layer supported by the substrate.

22. The method of claim 18, further comprising electromagnetically shielding the at least two diagnostic conductor portions.

23. The method of claim 22, further comprising providing an electromagnetic shield configured to reduce an eddy current in the electromagnetic shield when the electromagnetic shield is exposed to an AC magnetic field.

* * * * *

UNITED STATES PATENT AND TRADEMARK OFFICE
CERTIFICATE OF CORRECTION

PATENT NO. : 8,542,010 B2
APPLICATION NO. : 12/840324
DATED : September 24, 2013
INVENTOR(S) : Juan Manuel Cesaretti et al.

Page 1 of 2

It is certified that error appears in the above-identified patent and that said Letters Patent is hereby corrected as shown below:

Specification

Column 1, line 23 delete "having bother a normal" and replace with --having both a normal--.

Column 3, line 64 delete "FIG." and replace with --FIGS.--.

Column 4, line 7 delete "FIG." and replace with --FIGS--.

Column 4, line 18 delete "FIG." and replace with --FIGS.--.

Column 4, line 28 delete "FIG." and replace with --FIGS.--.

Column 5, line 1 delete "FIG-12 is block" and replace with --FIG. 12 is a block--.

Column 5, line 5 delete "FIG. 12A is block" and replace with --FIG. 12A is a block--.

Column 5, line 10 delete "FIG. 12B is block" and replace with --FIG. 12B is a block--.

Column 5, line 13 delete "FIG. 12C is block" and replace with --FIG. 12C is a block--.

Column 5, line 17 delete "FIG. 12D is block" and replace with --FIG. 12D is a block--.

Column 5, line 46 delete "by of FIG. 7" and replace with --by FIG. 7--.

Column 7, line 22 delete "sine" and replace with --sinc--.

Column 7, line 28 delete "sine" and replace with --sinc--.

Column 7, line 30 delete "sine" and replace with --sinc--.

Signed and Sealed this
Seventeenth Day of May, 2016

Michelle K. Lee
*Director of the United States Patent and Trademark Office*

CERTIFICATE OF CORRECTION (continued)
U.S. Pat. No. 8,542,010 B2

Specification

Column 7, line 31 delete "sine" and replace with --sinc--.

Column 7, line 34 delete "sine" and replace with --sinc--.

Column 7, line 36 delete "sine" and replace with --sinc--.

Column 7, line 39 delete "sine" and replace with --sinc--.

Column 8, line 28 delete "sine" and replace with --sinc--.

Column 9, line 62 delete "plus an minus" and replace with --plus and minus--.

Column 14, line 53 delete "sine" and replace with --sinc--.

Column 15, line 28 delete "164 o FIG." and replace with --164 of FIG.--.

Column 15, line 43 delete "sine" and replace with --sinc--.

Column 16, line 21 delete "sine" and replace with --sinc--.

Column 16, line 65 delete "164 o FIG. 8" and replace with --164 of FIG. 8--.

Column 17, line 16 delete "sine" and replace with --sinc--.

Column 17, line 17 delete "sine" and replace with --sinc--.

Column 17, line 65 delete "sine" and replace with --sinc--.

Column 18, line 15 delete "signal, e.g., 118)" and replace with --signal, (e.g., 118)--.

Column 21, line 13 delete "FIGS.7 8," and replace with --FIGS. 7, 8,--.